(12) United States Patent
Kim et al.

(10) Patent No.: US 12,356,764 B2
(45) Date of Patent: Jul. 8, 2025

(54) DISPLAY APPARATUS USING SEMICONDUCTOR LIGHT-EMITTING DEVICE

(71) Applicant: LG ELECTRONICS INC., Seoul (KR)

(72) Inventors: Youngdo Kim, Seoul (KR); Soohyun Kim, Seoul (KR); Indo Chung, Seoul (KR); Jeonghyo Kwon, Seoul (KR); Junoh Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 503 days.

(21) Appl. No.: 17/904,506

(22) PCT Filed: Feb. 25, 2020

(86) PCT No.: PCT/KR2020/002659
§ 371 (c)(1),
(2) Date: Aug. 18, 2022

(87) PCT Pub. No.: WO2021/167149
PCT Pub. Date: Aug. 26, 2021

(65) Prior Publication Data
US 2023/0110862 A1    Apr. 13, 2023

(30) Foreign Application Priority Data
Feb. 20, 2020   (KR) .................. 10-2020-0021215

(51) Int. Cl.
*H10H 20/831*   (2025.01)
*H01L 25/075*   (2006.01)
*H10H 20/857*   (2025.01)

(52) U.S. Cl.
CPC ....... *H10H 20/831* (2025.01); *H01L 25/0753* (2013.01); *H10H 20/857* (2025.01)

(58) Field of Classification Search
CPC .... H10H 20/831; H10H 20/857; H10H 20/81; H10H 29/142; H10H 20/83; H01L 25/0753; H01L 21/67144; H01L 21/76895
See application file for complete search history.

(56) References Cited

U.S. PATENT DOCUMENTS

2017/0317154 A1* 11/2017 Heo .................. H10K 50/824
2019/0172819 A1   6/2019 Bae et al.
(Continued)

FOREIGN PATENT DOCUMENTS

KR   2019-0096474   8/2019
KR   2019-0106885   9/2019
(Continued)

OTHER PUBLICATIONS

Korean Intellectual Property Office Application No. 10-2020-0021215, Office Action dated Sep. 13, 2024, 6 pages.
(Continued)

*Primary Examiner* — Victor A Mandala
(74) *Attorney, Agent, or Firm* — LEE, HONG, DEGERMAN, KANG & WAIMEY

(57) ABSTRACT

A display apparatus according to the present invention comprises a substrate including semiconductor light-emitting devices and a wiring electrode electrically connected to the semiconductor light-emitting devices, wherein the substrate comprises: a base portion; assembly electrodes extending in one direction and arranged on the base portion; a dielectric layer formed to cover the assembly electrodes; a barrier portion formed on the dielectric layer while forming a cell on which the semiconductor light-emitting devices are mounted along an extension direction of the assembly electrodes; and a planarization layer formed to cover the barrier portion while forming a hole overlapping the cell, wherein the hole comprises: a first hole exposing the semi-
(Continued)

conductor light-emitting device; and a second hole exposing the dielectric layer or the base portion.

10 Claims, 23 Drawing Sheets

(56) References Cited

U.S. PATENT DOCUMENTS

| | | | | |
|---|---|---|---|---|
| 2019/0181301 A1* | 6/2019 | Kim | .................... | H10H 20/857 |
| 2020/0152826 A1* | 5/2020 | Lee | .................... | H10H 20/01 |
| 2020/0212102 A1* | 7/2020 | Park | .................... | H10H 20/831 |
| 2020/0212267 A1* | 7/2020 | Kwak | .................... | H10H 20/8513 |
| 2021/0005794 A1* | 1/2021 | Sakong | ................ | H10H 20/854 |
| 2021/0013186 A1* | 1/2021 | Chen | .................... | H01L 25/0753 |
| 2021/0272938 A1* | 9/2021 | Chang | .................... | H10H 20/857 |
| 2021/0399165 A1* | 12/2021 | Lee | .................... | H10H 20/857 |
| 2022/0254961 A1* | 8/2022 | Chang | .................... | H01L 24/95 |
| 2023/0064316 A1* | 3/2023 | Park | .................... | H10H 20/857 |
| 2023/0070416 A1* | 3/2023 | Kwon | .................... | H01L 21/768 |
| 2023/0352643 A1* | 11/2023 | Cho | .................... | H10H 20/857 |

FOREIGN PATENT DOCUMENTS

| | | |
|---|---|---|
| KR | 10-2019-0122117 | 10/2019 |
| KR | 2020-0013190 | 2/2020 |
| KR | 2020-0014868 | 2/2020 |

OTHER PUBLICATIONS

PCT International Application No. PCT/KR2020/002659, International Search Report dated Nov. 13, 2020, 4 page.

* cited by examiner (a)

(b)

(a)  (b)

(a)

(b)

(a)

(b)

DISPLAY APPARATUS USING SEMICONDUCTOR LIGHT-EMITTING DEVICE

CROSS-REFERENCE TO RELATED APPLICATIONS

This application is the National Stage filing under 35 U.S.C. 371 of International Application No. PCT/KR2020/002659, filed on Feb. 25, 2020, which claims the benefit of earlier filing date and right of priority to Korean Application No. 10-2020-0021215, filed on Feb. 20, 2020, the contents of which are all hereby incorporated by reference herein in their entireties.

TECHNICAL FIELD

The present disclosure relates to a display device (display apparatus) using a semiconductor light-emitting device, and more particularly, to a display device (display apparatus) using a semiconductor light-emitting device having a size of several to tens of µm.

BACKGROUND ART

In recent years, liquid crystal displays (LCDs), organic light-emitting diode (OLED) displays, and micro-LED displays have been competed to implement a large-area display in the field of display technology.

Among them, a display using a semiconductor light-emitting device (micro-LED) having a diameter or cross-sectional area of 100 µm or less may provide very high efficiency because it does not absorb light using a polarizing plate or the like.

However, since millions of semiconductor light-emitting devices are required to implement a large area in the case of a micro-LED display, it has difficulty in transferring the devices compared to other technologies.

Technologies currently in development for transfer processes of micro-LEDs include pick & place, laser lift-off (LLO), self-assembly, or the like. Among them, the self-assembly method, which is a method in which the semiconductor light-emitting device locates themselves in a fluid, is the most advantageous method for realizing a large-sized display device (display apparatus).

Meanwhile, the self-assembly method may include a method of directly transferring semiconductor light-emitting devices to a substrate to be used as a product, and a method of transferring semiconductor light-emitting devices to a substrate for assembly and then transferring them to a substrate to be used as a product. The former undergoes a transfer process once, so it is efficient in terms of the process, and the latter has an advantage capable of adding a structure for self-assembly to a substrate for assembly with no limitation, and those two methods are selectively used.

DISCLOSURE OF INVENTION

Technical Problem

An aspect of the present disclosure is to provide a display device (display apparatus) having a high light-emitting efficiency. To this end, the present disclosure provides a structure in which a short does not occur between wiring electrodes in a region where a semiconductor light-emitting device is not assembled, and a method of implementing the same.

Solution to Problem

A display device (display apparatus) according to the present disclosure may include semiconductor light-emitting devices and a substrate including a wiring electrode electrically connected to the semiconductor light-emitting devices, wherein the substrate includes a base portion; assembly electrodes disposed on the base portion to extend in one direction; a dielectric layer formed to cover the assembly electrodes; a partition wall portion formed on the dielectric layer while forming a cell on which the semiconductor light-emitting devices are placed along an extension direction of the assembly electrodes; and a planarization layer formed to cover the partition wall portion while forming a hole to overlap the cell, and the hole includes a first hole that exposes the semiconductor light-emitting device; and a second hole that exposes the dielectric layer or the base portion.

According to the present disclosure, the wiring electrode may include a lower wiring electrode formed on the dielectric layer to extend in the same direction as the assembly electrodes; and an upper wiring electrode formed on the planarization layer to extend to the semiconductor light-emitting device through the first hole or to extend to the dielectric layer or the base portion through the second hole.

According to the present disclosure, the lower wiring electrode may overlap the cell so as to be in contact with a semiconductor light-emitting device placed on the cell in a region where the cell is formed, or may be disconnected so as not to overlap the cell in the region where the cell is formed.

According to the present disclosure, two assembly electrodes adjacent among the assembly electrodes may form pair electrodes, and the lower wiring electrode may be disposed between the pair electrodes.

According to the present disclosure, the first hole and the second hole may be formed to have the same thickness in a width direction as that of the lower wiring electrode or to be thicker in the width direction than that of the lower wiring electrode.

A display apparatus according to the present disclosure may include semiconductor light-emitting devices and a substrate including a wiring electrode electrically connected to the semiconductor light-emitting devices, wherein the substrate includes a base portion; assembly electrodes disposed on the base portion to extend in one direction; a dielectric layer formed to cover the assembly electrodes; and a partition wall portion formed on the dielectric layer while forming a cell on which the semiconductor light-emitting devices are placed along an extension direction of the assembly electrodes; an organic layer formed to fill into the cell; and a planarization layer formed on the organic layer while forming a hole to overlap the cell, and the hole includes a first hole that exposes the semiconductor light-emitting device; and a second hole that exposes the organic layer.

According to the present disclosure, the wiring electrode may include a lower wiring electrode formed on the dielectric layer to extend in the same direction as the assembly electrodes; and an upper wiring electrode formed on the planarization layer to extend to the semiconductor light-emitting device through the first hole or to extend to the organic layer through the second hole.

According to the present disclosure, two assembly electrodes adjacent among the assembly electrodes may form pair electrodes, and the lower wiring electrode may be disposed between the pair electrodes.

According to the present disclosure, the semiconductor light-emitting device may include a first conductive electrode; a first conductive semiconductor layer disposed on the first conductive electrode; an active layer disposed on the first conductive semiconductor layer; a second conductive semiconductor layer disposed on the active layer; and a second conductive electrode disposed on the second conductive semiconductor layer, wherein the lower wire electrode is electrically connected to the first conductive electrode, and the upper wire electrode is electrically connected to the second conductive electrode.

According to the present disclosure, the semiconductor light-emitting device may include a passivation layer formed to cover a side surface of the semiconductor light-emitting device and a portion of the second conductive electrode.

Advantageous Effects of Invention

According to the present disclosure, a process of removing a lower wiring electrode that is exposed inside a cell or that overlaps the cell may be carried out in consideration of the possibility of existence of a region where a semiconductor light-emitting device is not assembled so as to prevent a phenomenon in which an upper wiring electrode and the lower wiring electrode are connected to cause a short, thereby preparing for a problem of luminance decrease due to a failure of all semiconductor light-emitting devices connected to a specific electrode line to be turned on.

Alternatively, according to the present disclosure, an organic layer may be further formed to fill into the cell prior to forming a planarization layer on which the upper wiring electrode is formed in consideration of the possibility of existence of a region where the semiconductor light-emitting device is not assembled so as not to etch the organic layer on the planarization layer even when a pattern for forming the upper wiring electrode on the upper wiring electrode, thereby preventing a phenomenon in which the upper wiring electrode and the lower wiring electrode exposed inside the cell are connected to cause a short.

Furthermore, according to the present disclosure, a process for preventing a short between the upper and lower wiring electrodes may be performed in a relatively simple and inexpensive manner.

Moreover, according to the present disclosure, a vertical semiconductor light-emitting device may be used, thereby manufacturing a high-resolution display device (display apparatus) while securing a sufficient light-emitting area compared to a horizontal semiconductor light-emitting device.

MODE FOR THE INVENTION

Figure 1:
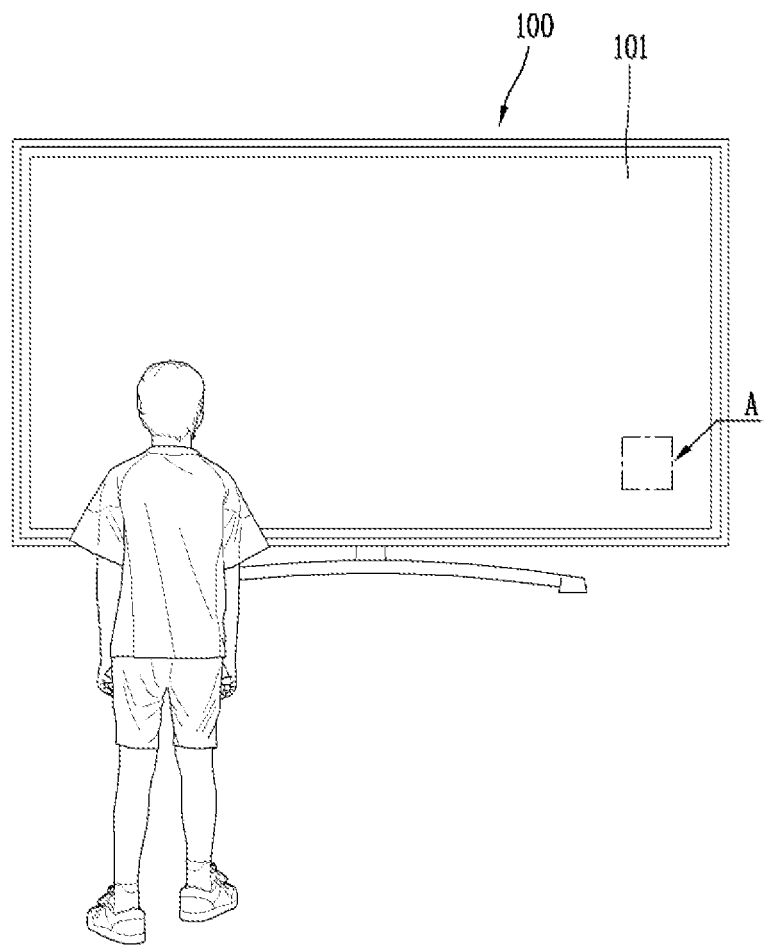
FIG. 1 is a conceptual view showing a display device (display apparatus) using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the other element or an intermediate element may also be interposed therebetween.

A display device (display apparatus) disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

Figure 2:
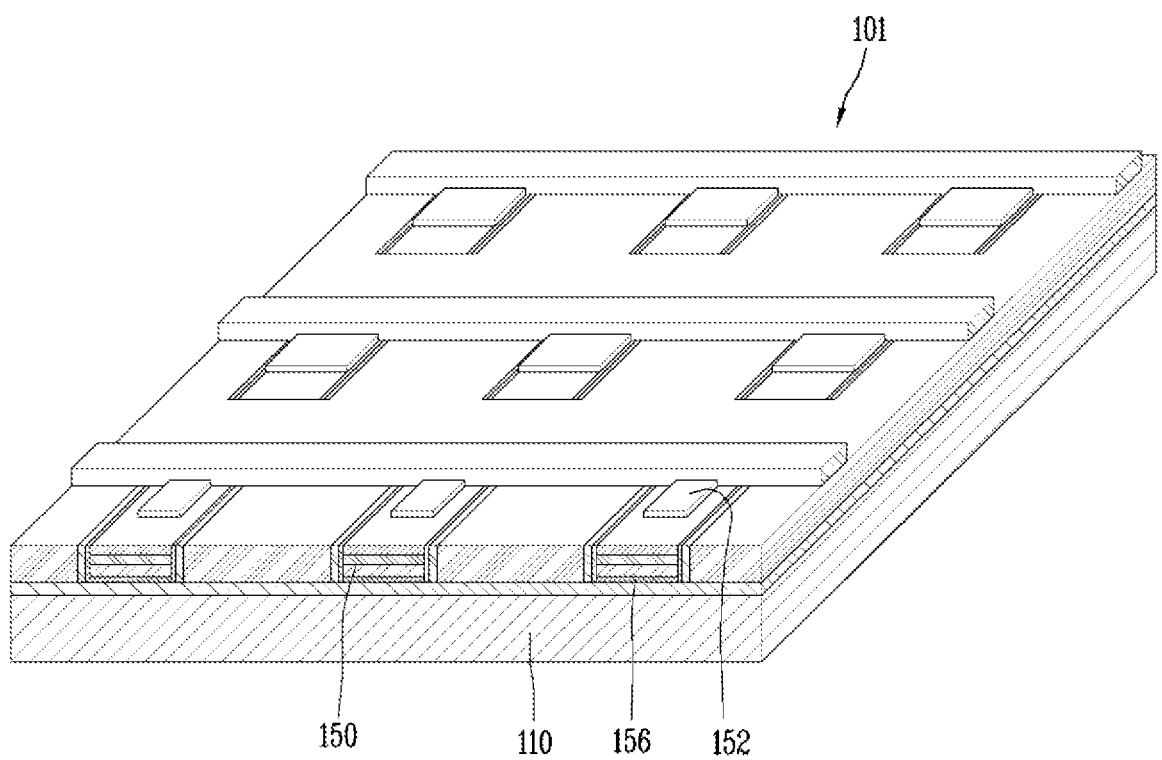
FIG. 2 is a partially enlarged view showing a portion "A" of the display device (display apparatus) in FIG. 1.
Figure 3:
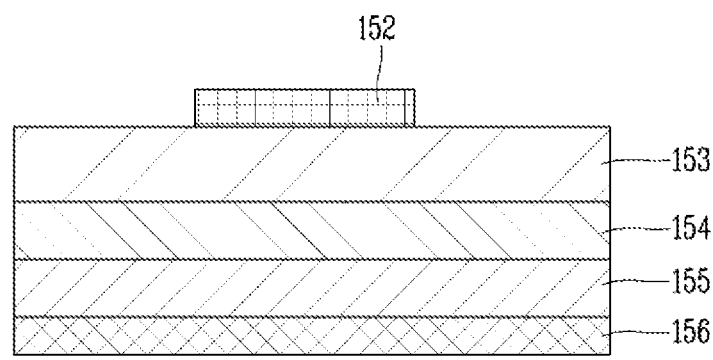
FIG. 3 is an enlarged view showing a semiconductor light-emitting device in FIG. 2.
Figure 4:
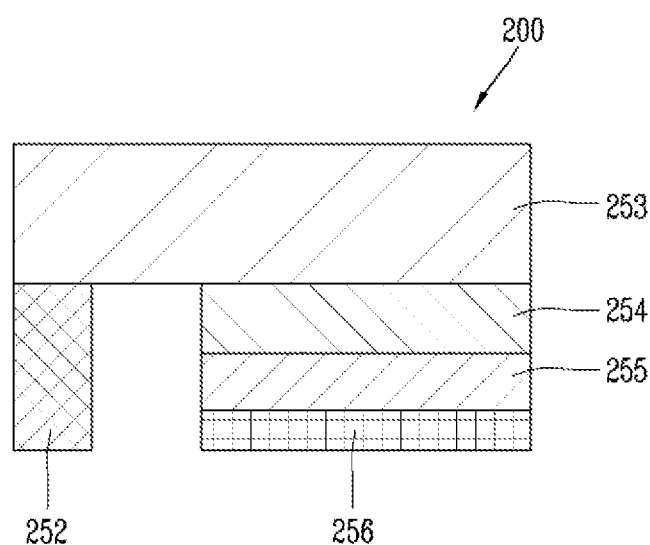
FIG. 4 is an enlarged view showing another embodiment of the semiconductor light-emitting device in FIG. 2.

FIG. 1 is a conceptual view showing a display device (display apparatus) using a semiconductor light-emitting device according to an embodiment of the present disclosure, and FIG. 2 is a partially enlarged view showing a portion "A" of the display device (display apparatus) in FIG. 1, and FIG. 3 is an enlarged view showing a semiconductor light-emitting device in FIG. 2, and FIG. 4 is an enlarged view showing another embodiment of the semiconductor light-emitting device in FIG. 2.

According to the illustration, information processed in the controller of the display device (display apparatus) 100 may be displayed on a display module 140. A case 101 in the form of a closed loop surrounding an edge of the display module 140 may form a bezel of the display device (display apparatus) 100.

The display module 140 may include a panel 141 on which an image is displayed, and the panel 141 may include micro-sized semiconductor light-emitting devices 150 and a wiring substrate 110 on which the semiconductor light-emitting devices 150 are mounted.

Wiring lines may be formed on the wiring substrate 110, and connected to an n-type electrode 152 and a p-type electrode 156 of the semiconductor light-emitting device 150. Through this, the semiconductor light-emitting device 150 may be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro-LED (Light-emitting Diode) is illustrated as one type of the semiconductor light-emitting device 150 that converts current into light. The micro-LED may be a light-emitting diode formed with a small size of 100 μm or less. The semiconductor light-emitting device 150 may be provided in blue, red, and green light-emitting regions, respectively, to implement a sub-pixel by a combination of the light-emitting regions. In other words, the sub-pixel denotes a minimum unit for implementing a single color, and at least three micro-LEDs may be provided in the sub-pixel.

More specifically, referring to FIG. 3, the semiconductor light-emitting device 150 may be a vertical structure.

For example, the semiconductor light-emitting device 150 may be implemented with a high-power light-emitting device that emits various lights including blue in which gallium nitride (GaN) is mostly used, and indium (In) and or aluminum (Al) are added thereto.

The vertical semiconductor light-emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate 110, and the n-type electrode 152 located at the top may be electrically connected to an n-electrode at an upper side of the semiconductor light-emitting device 150. The electrodes may be disposed in the upward/downward direction in the vertical semiconductor light-emitting device 150, thereby providing a great advantage capable of reducing the chip size.

For another example, referring to FIG. 4, the semiconductor light-emitting device may be a flip chip type semiconductor light-emitting device.

For such an example, the semiconductor light-emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate 110 at the bottom of the semiconductor light-emitting device 250.

The vertical semiconductor light-emitting device 150 and the horizontal semiconductor light-emitting device 250 may be a green semiconductor light-emitting device, a blue semiconductor light-emitting device, and a red semiconductor light-emitting device, respectively. The green semiconductor light-emitting device and the blue semiconductor light-emitting device may be mostly formed of gallium nitride (GaN), and indium (In) and/or aluminum (Al) may be added thereto to implement a high-power light-emitting device that emits green or blue light. For such an example, the semiconductor light-emitting device may be a gallium nitride thin-film formed in various layers such as n-GaN, p-GaN, AlGaN, and InGa, and specifically, the p-type semiconductor layer may be p-type GaN, and the n-type semiconductor layer may be n-type GaN. However, in case of the red semiconductor light-emitting device, the p-type semiconductor layer may be p-type GaAs and the n-type semiconductor layer may be n-type GaAs.

Furthermore, the p-type semiconductor layer may be p-type GaN doped with Mg on a p-electrode side, and the n-type semiconductor layer may be n-type GaN doped with Si on an n-electrode side. In this case, the above-described semiconductor light-emitting devices may be semiconductor light-emitting devices without an active layer.

On the other hand, referring to FIGS. 1 through 4, since the light-emitting diode is very small, the display panel may be arranged with self-emitting sub-pixels arranged at fine pitch, thereby implementing a high-quality display device (display apparatus).

In a display device (display apparatus) using the semiconductor light-emitting device of the present disclosure described above, a semiconductor light-emitting device grown on a wafer and formed through mesa and isolation is used as an individual pixel.

In this case, the micro-sized semiconductor light-emitting device 150 must be transferred to a wafer at a predetermined position on the substrate of the display panel. Pick & place is used for the transfer technology, but the success rate is low and a lot of time is required. For another example, there is a technology of transferring a plurality of devices at one time using a stamp or a roll, but the yield is limited and not suitable for a large screen display.

The present disclosure proposes a new fabrication method of a display device (display apparatus) capable of solving the foregoing problems and a fabrication device using the same.

For this purpose, first, a new fabrication method of the display device (display apparatus) will be described. FIGS.

5A to 5E are conceptual views for explaining a new process of manufacturing the foregoing semiconductor light-emitting device.

In this specification, a display device (display apparatus) using a passive matrix (PM) semiconductor light-emitting device is illustrated. However, an example described below may also be applicable to an active matrix (AM) type semiconductor light-emitting device. In addition, a method of self-assembling a horizontal semiconductor light-emitting device is illustrated below, but it is also applicable to a method of self-assembling a vertical semiconductor light-emitting device.

Figure 5A:
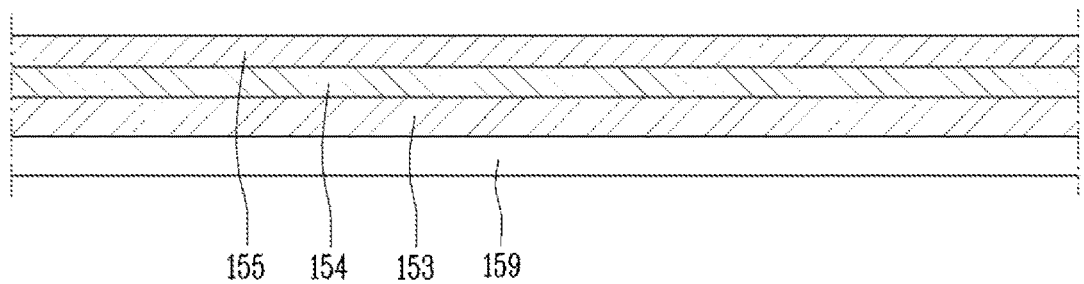
FIGS. 5A to 5E are conceptual views for explaining a new process of manufacturing the foregoing semiconductor light-emitting device.

First, according to a manufacturing method, a first conductive semiconductor layer 153, an active layer 154, and a second conductive semiconductor layer 155 are respectively grown on a growth substrate 159 (FIG. 5A).

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

Furthermore, although the present embodiment illustrates a case in which the active layer 154 is present, a structure in which the active layer 154 is not present can be made in some cases as described above. For such an example, the p-type semiconductor layer may be p-type GaN doped with Mg on a p-electrode side, and the n-type semiconductor layer may be n-type GaN doped with Si on an n-electrode side.

The growth substrate 159 (wafer) may be formed of any one of light transmitting materials, for example, sapphire ($Al_2O_3$), GaN, ZnO, and AlO, but is not limited thereto. In addition, the growth substrate 159 may be formed of a material suitable for semiconductor material growth (carrier wafer) or a material having excellent thermal conductivity. The growth substrate 159 includes a conductive substrate or an insulating substrate, and for example, a SiC substrate having higher thermal conductivity than a sapphire ($Al_2O_3$) substrate or at least one of Si, GaAs, GaP, InP, and $Ga_2O_3$ may be used.

Figure 5B:
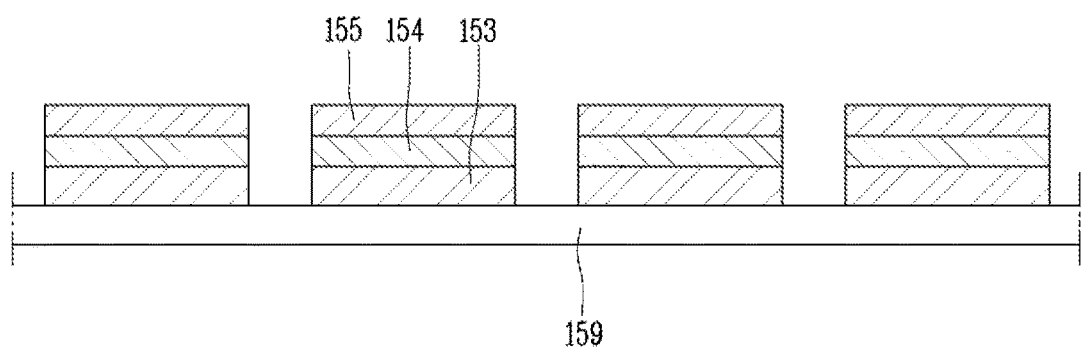

Next, at least part of the first conductive semiconductor layer 153, the active layer 154, and the second conductive semiconductor layer 155 is removed to form a plurality of semiconductor light-emitting devices (FIG. 5B).

More specifically, isolation is performed so that a plurality of semiconductor light-emitting devices form a light-emitting device array. In other words, the first conductive semiconductor layer 153, the active layer 154, and the second conductive semiconductor layer 155 are etched in a vertical direction to form a plurality of semiconductor light-emitting devices.

If it is a case of forming the horizontal semiconductor light-emitting device, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light-emitting device arrays.

Figure 5C:
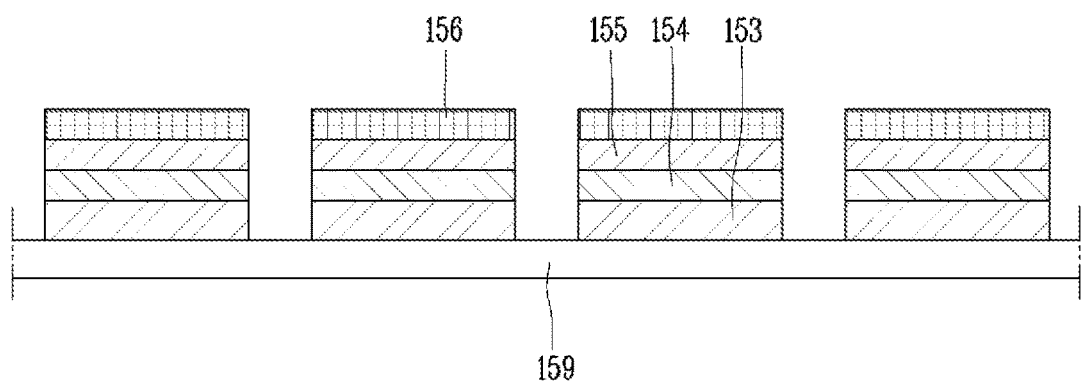

Next, a second conductive electrode 156 (or a p-type electrode) is respectively formed on one surface of the second conductive semiconductor layer 155 (FIG. 5C). The second conductive electrode 156 may be formed by a deposition process such as sputtering, but is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Figure 5D:
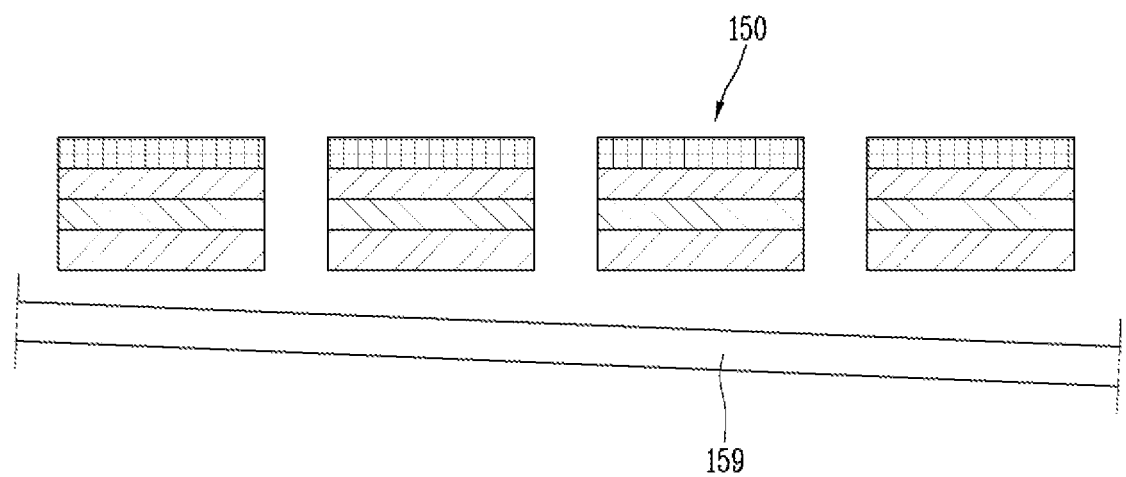

Then, the growth substrate 159 is removed to provide a plurality of semiconductor light-emitting devices. For example, the growth substrate 159 may be removed using a laser lift-off (LLO) or chemical lift-off (CLO) method (FIG. 5D).

Figure 5E:
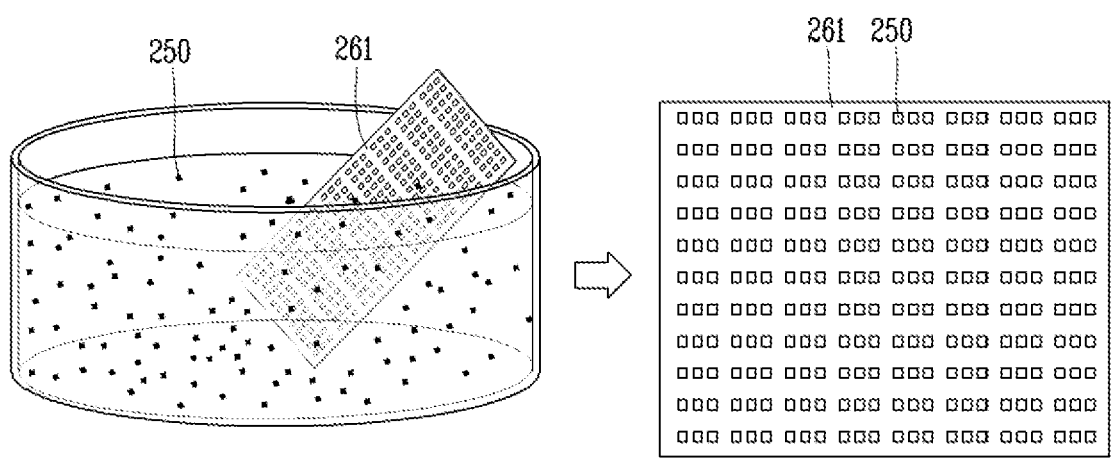

Then, placing the semiconductor light-emitting devices 150 on the substrate in a chamber filled with a fluid is carried out (FIG. 5E).

For example, the semiconductor light-emitting devices 150 and the substrate are placed in a chamber filled with a fluid, and the semiconductor light-emitting devices 150 are assembled to the substrate by themselves using flow, gravity, surface tension, or the like. In this case, the substrate may be an assembly substrate 161.

For another example, the wiring substrate may also be placed into the fluid chamber instead of the assembly substrate 161 such that the semiconductor light-emitting devices 150 are directly placed on the wiring substrate. However, for convenience of description, in the present disclosure, it is illustrated that the substrate is provided as an assembly substrate 161 and the semiconductor light-emitting devices 150 are placed thereon.

Cells (not shown) into which the semiconductor light-emitting devices 150 are fitted may be provided on the assembly substrate 161 so that the semiconductor light-emitting devices 150 are easily placed on the assembly substrate 161. Specifically, cells on which the semiconductor light-emitting devices 150 are placed are formed on the assembly substrate 161 at positions where the semiconductor light-emitting devices 150 are aligned with the wiring electrodes. The semiconductor light-emitting devices 150 are assembled into the cells while moving in the fluid.

After the plurality of semiconductor light-emitting devices 150 are placed on the assembly substrate 161, when the semiconductor light-emitting devices 150 of the assembly substrate 161 are transferred to a wiring substrate, large-area transfer can be made. Therefore, the assembly substrate 161 may be referred to as a temporary substrate.

Meanwhile, in order to apply the self-assembly method described above to the manufacture of a large-screen display, it is necessary to increase the transfer yield. The present disclosure proposes a method and device for minimizing the influence of gravity or friction and preventing non-specific binding in order to increase the transfer yield.

In this case, in a display device (display apparatus) according to the present disclosure, a magnetic body is disposed on the semiconductor light-emitting device to move the semiconductor light-emitting device using a magnetic force, and place the semiconductor light-emitting device at a preset position using an electric field in the movement process. Hereinafter, such a transfer method and device will be described in more detail with reference to the accompanying drawings.

Figure 6:
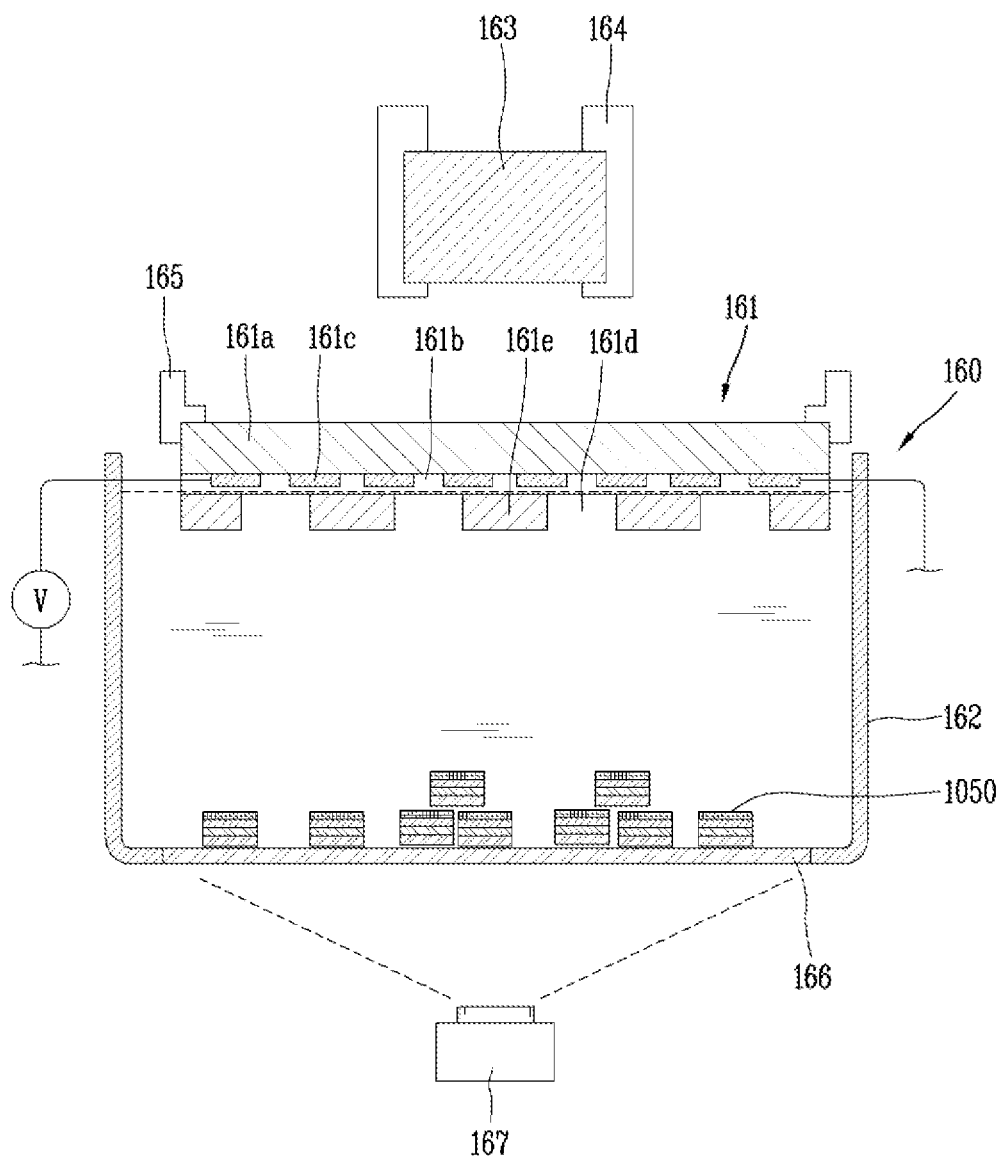
FIG. 6 is a conceptual view showing an example of a self-assembly device of semiconductor light-emitting devices according to the present disclosure.
Figure 7:
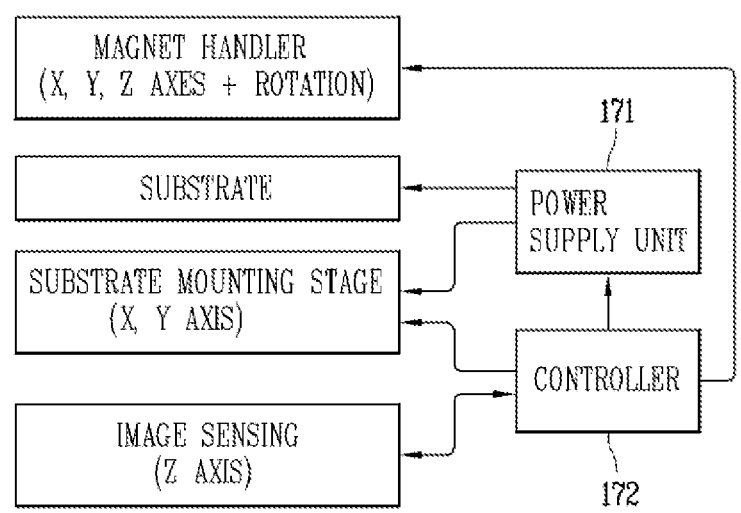
FIG. 7 is a block diagram showing the self-assembly device in FIG. 6.

FIG. 6 is a conceptual view showing an example of a self-assembly device of semiconductor light-emitting devices according to the present disclosure, and FIG. 7 is a block diagram showing the self-assembly device in FIG. 6. FIGS. 8A to 8E are conceptual views showing a process of self-assembling semiconductor light-emitting devices using the self-assembly device in FIG. 6, and FIG. 9 is a conceptual view for explaining the semiconductor light-emitting device in FIGS. 8A to 8E.

According to the illustration of FIGS. 6 and 7, a self-assembly device 160 of the present disclosure may include a fluid chamber 162, a magnet 163, and a location controller 164.

The fluid chamber 162 has a space for accommodating a plurality of semiconductor light-emitting devices. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The fluid chamber 162 may be disposed such that an assembly surface of the substrate 161 on which the semiconductor light-emitting devices 150 are assembled faces downward. For example, the substrate 161 may be transferred to an assembly position by a transfer unit, and the transfer unit may include a stage 165 on which the substrate is mounted. The position of the stage 165 may be controlled by a controller, and through this, the substrate 161 may be transferred to the assembly position.

At this time, the assembly surface of the substrate 161 faces the bottom of the fluid chamber 162 at the assembly position. According to the illustration, the assembly surface of the substrate 161 is disposed so as to be immersed in a fluid in the fluid chamber 162. Therefore, the semiconductor light-emitting devices 150 are moved to the assembly surface in the fluid.

The substrate 161, which is an assembly substrate on which an electric field can be formed, may include a base portion 161*a*, a dielectric layer 161*b* and a plurality of electrodes 161*c*.

The base portion 161*a* may be made of an insulating material, and the plurality of electrodes 161*c* may be a thin or a thick film bi-planar electrode patterned on one side of the base portion 161*a*. The electrode 161*c* may be formed of, for example, a stack of Ti/Cu/Ti, an Ag paste, ITO, and the like.

The dielectric layer 161*b* may be made of an inorganic material such as $SiO_2$, SiNx, SiON, $Al_2O_3$, $TiO_2$, $HfO_2$. Alternatively, the dielectric layer 161*b* may be composed of a single layer or multiple layers as an organic insulator. A thickness of the dielectric layer 161*b* may be several tens of nanometers to several micrometers.

Furthermore, the substrate 161 according to the present disclosure includes a plurality of cells 161*d* partitioned by partition walls. The cells 161*d* may be sequentially arranged along one direction, and made of a polymer material. In addition, the partition wall 161*e* constituting the cells 161*d* is configured to be shared with neighboring cells 161*d*. The partition walls 161*e* are protruded from the base portion 161*a*, and the cells 161*d* may be sequentially arranged along the one direction by the partition walls 161*e*. More specifically, the cells 161*d* are sequentially arranged in row and column directions, and may have a matrix structure.

An inside of the cells 161*d* has a groove for accommodating the semiconductor light-emitting device 150, and the groove may be a space defined by the partition walls 161*e*. The shape of the groove may be the same as or similar to that of the semiconductor light-emitting device. For example, when the semiconductor light-emitting device is in a rectangular shape, the groove may be a rectangular shape. In addition, when the semiconductor light-emitting device is circular, the grooves formed in the cells may be formed in a circular shape. Moreover, each of the cells 161*d* is configured to accommodate a single semiconductor light-emitting device. In other words, a single semiconductor light-emitting device is accommodated in a single cell.

Meanwhile, the plurality of electrodes 161*c* include a plurality of electrode lines disposed at the bottom of each of the cells 161*d*, and the plurality of electrode lines may be configured to extend to neighboring cells.

The plurality of electrodes 161*c* are disposed below the cells 161*d* and applied with different polarities to generate an electric field in the cells 161*d*. In order to form the electric field, the dielectric layer 161*b* may form the bottom of the cells 161*d* while the dielectric layer 161*b* covers the plurality of electrodes 161*c*. In such a structure, when different polarities are applied to a pair of electrodes 161*c* from a lower side of each cell 161*d*, an electric field may be formed, and the semiconductor light-emitting device may be inserted into the cells 161*d* by the electric field.

At the assembly position, the electrodes of the substrate 161 are electrically connected to the power supply unit 171. The power supply unit 171 applies power to the plurality of electrodes 161*c* to generate the electric field.

According to the illustration, the self-assembly device may include a magnet 163 for applying a magnetic force to the semiconductor light-emitting devices 150. The magnet 163 is spaced apart from the fluid chamber 162 to apply a magnetic force to the semiconductor light-emitting devices 150. The magnet 163 may be disposed to face an opposite side of the assembly surface of the substrate 161, and the location of the magnet 163 is controlled by the location controller 164 connected to the magnet 163.

The semiconductor light-emitting device may have a magnetic body so as to move in the fluid by the magnetic field of the magnet 163.

Referring to FIG. 9, the semiconductor light-emitting device 1050 having a magnetic body may include a first conductive electrode 1052 and a second conductive electrode 1056, a first conductive semiconductor layer 1053 disposed with the first conductive electrode 1052, a second conductive semiconductor layer 1055 configured to overlap the first conductive semiconductor layer 1053, and disposed with the second conductive electrode 1056, and an active layer 1054 disposed between the first and second conductive semiconductor layers 1053, 1055.

Here, the first conductive type and the second conductive type may be p-type and n-type, respectively, and vice versa. Furthermore, as described above, it may be a semiconductor light-emitting device without having the active layer.

Meanwhile, in the present disclosure, the first conductive electrode 1052 may be generated after the semiconductor light-emitting device 1050 is assembled on a wiring board by self-assembly or the like. In addition, in the present disclosure, the second conductive electrode 1056 may include a magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light-emitting device 1050 may include a first layer 1056a and a second layer 1056b, wherein the first layer 1056a may include a magnetic body, and the second layer 1056b may include a metal material rather than a magnetic body.

In this example, the first layer 1056a including a magnetic body may be disposed to be in contact with the second conductive semiconductor layer 1055. In this case, the first layer 1056a may be disposed between the second layer 1056b and the second conductive semiconductor layer 1055, and the second layer 1056b may be a contact metal connected to a wiring of the wiring substrate. However, the present disclosure is not necessarily limited thereto, and the magnetic body may be disposed on one surface of the first conductive semiconductor layer 1053.

Referring again to FIGS. 6 and 7, the self-assembly device may include a magnet handler that can be automatically or manually moved in the x, y, and z axes on the top of the fluid chamber 162 or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light-emitting devices may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembly device described above is configured to use a combination of a magnetic field and an electric field, and using those fields, the semiconductor light-emitting devices may be placed at preset positions of the substrate by an electric field in the process of being moved by a location change of the magnet. Hereinafter, an assembly process using the self-assembly device described above will be described in more detail.

First, a plurality of semiconductor light-emitting devices 1050 having magnetic bodies are formed through the process described with reference to FIGS. 5A to 5C. In this case, a magnetic body may be deposited in the process of forming the second conductive electrode in FIG. 5C.

Figure 8A:
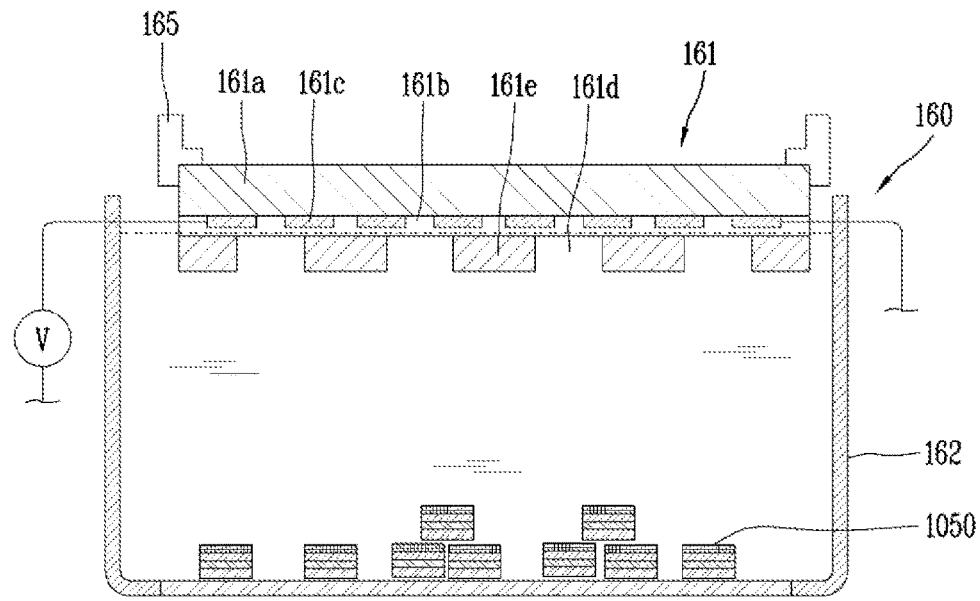
FIGS. 8A to 8E are conceptual views showing a step of self-assembling semiconductor light-emitting devices using the self-assembly device in FIG. 6.
Figure 9:
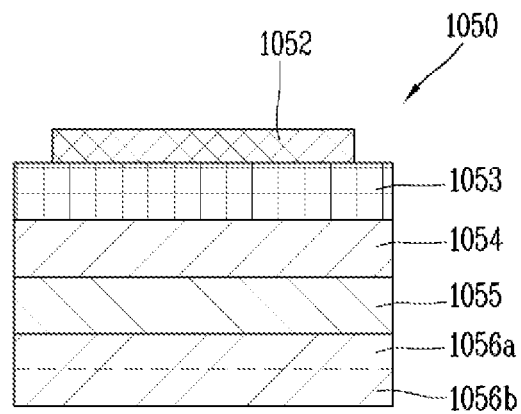
FIG. 9 is a conceptual view for explaining the semiconductor light-emitting device in FIGS. 8A to 8E.

Next, the substrate 161 is transferred to the assembly position, and the semiconductor light-emitting devices 1050 are placed into the fluid chamber 162 (FIG. 8A).

As described above, the assembly position of the substrate 161 is a position at which the assembly surface on which the semiconductor light-emitting devices 1050 of the substrate 161 are assembled is disposed in a downward direction in the fluid chamber 162.

In this case, some of the semiconductor light-emitting devices 1050 may sink to the bottom of the fluid chamber 162 and some may float in the fluid. When the light transmitting bottom plate 166 is provided in the fluid chamber 162, some of the semiconductor light-emitting devices 1050 may sink to the bottom plate 166.

Figure 8B:
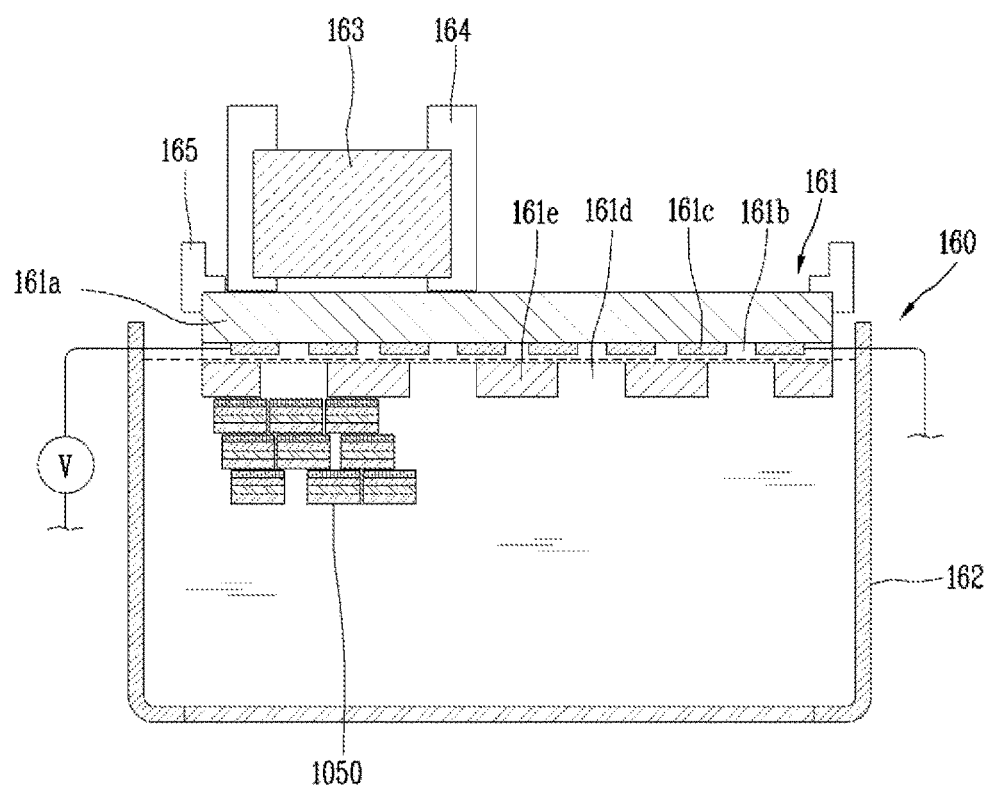

Next, a magnetic force is applied to the semiconductor light-emitting devices 1050 so that the semiconductor light-emitting devices 1050 float in the fluid chamber 162 in a vertical direction (FIG. 8B).

When the magnet 163 of the self-assembly device moves from its original position to an opposite side of the assembly surface of the substrate 161, the semiconductor light-emitting devices 1050 float in the fluid toward the substrate 161. The original position may be a position away from the fluid chamber 162. For another example, the magnet 163 may be configured as an electromagnet, and in this case, electricity is supplied to the electromagnet to generate an initial magnetic force.

Meanwhile, in this example, a separation distance between the assembly surface of the substrate 161 and the semiconductor light-emitting devices 1050 may be controlled by adjusting the magnitude of the magnetic force. For example, the separation distance may be controlled using the weight, buoyancy, and magnetic force of the semiconductor light-emitting devices 1050. The separation distance may be several mm to several tens of μm from the outermost surface of the substrate.

Figure 8C:
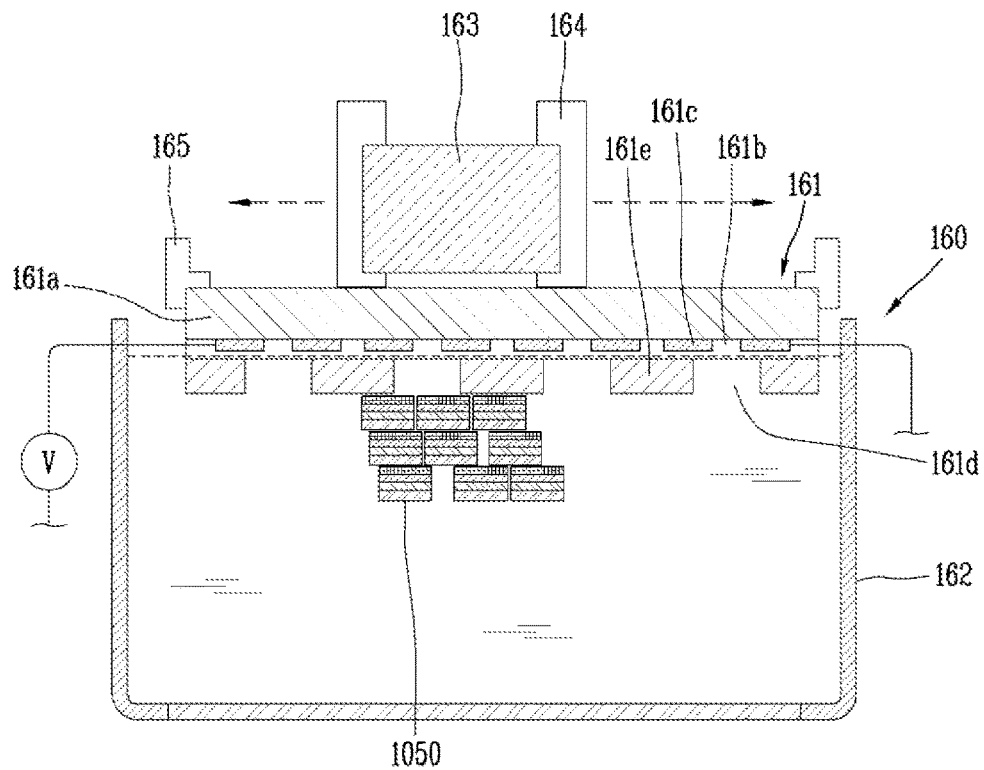

Next, a magnetic force is applied to the semiconductor light-emitting devices 1050 so that the semiconductor light-emitting devices 1050 move in one direction in the fluid chamber 162. For example, the magnet 163 is moved in a horizontal direction, a clockwise direction or a counterclockwise direction with respect to the substrate 161 (FIG. 8C). In this case, the semiconductor light-emitting devices 1050 move in a direction parallel to the substrate 161 at a position spaced apart from the substrate 161 by the magnetic force.

Next, applying an electric field to guide the semiconductor light-emitting devices 1050 to preset positions of the substrate 161 so as to allow the semiconductor light-emitting devices 1050 to be placed at the preset positions during the movement of the semiconductor light-emitting devices 250 is carried out (FIG. 8C).

For example, the semiconductor light-emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to guide assembly only at preset positions using the electric field. In other words, the semiconductor light-emitting devices 1050 are assembled to the assembly position of the substrate 161 using a selectively generated electric field. For this purpose, the substrate 161 may include cells in which the semiconductor light-emitting devices 1050 are inserted.

Then, the unloading process of the substrate 161 is carried out, and the assembly process is completed. When the substrate 161 is an assembly substrate, a post-process of transferring the arrayed semiconductor light-emitting devices to a wiring substrate as described above to implement a display device (display apparatus) may be carried out.

Figure 8D:
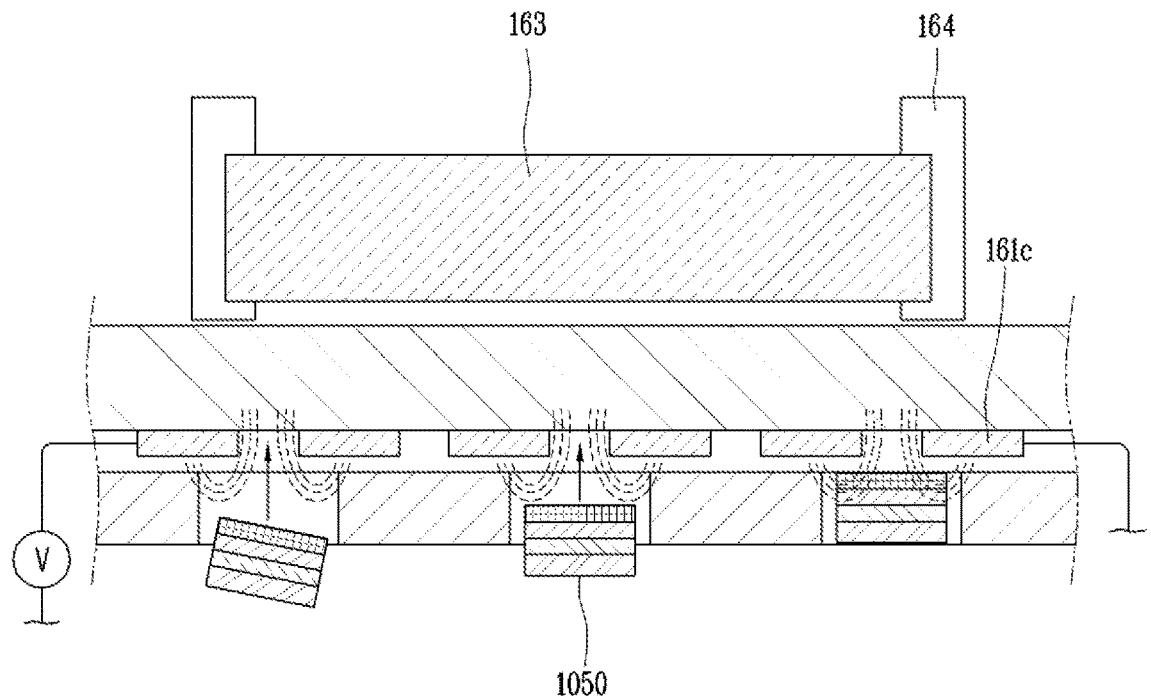
Figure 8E:
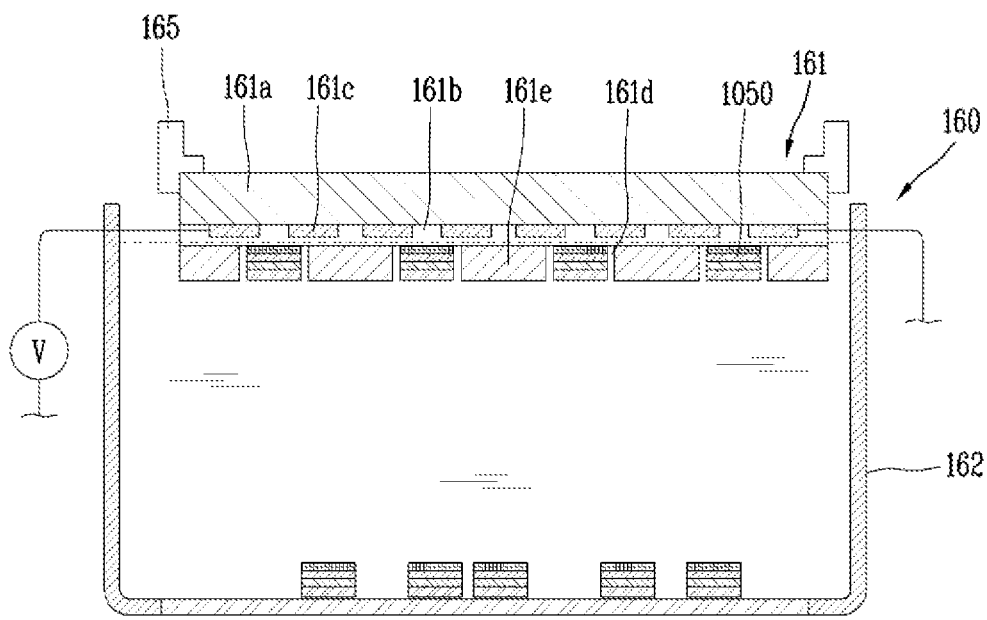

On the other hand, the semiconductor light-emitting devices 1050 may be guided to the preset positions, then the magnet 163 may move in a direction away from the substrate 161 such that the semiconductor light-emitting devices 1050 remaining in the fluid chambers 162 fall to the bottom of the fluid chambers 162, (FIG. 8D). For another example, if power supply is stopped when the magnet 163 is an electromagnet, then the semiconductor light-emitting devices 1050 remaining in the fluid chamber 162 may fall to the bottom of the fluid chamber 162.

Then, when the semiconductor light-emitting devices 1050 on the bottom of the fluid chamber 162 are collected, the collected semiconductor light-emitting devices 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. That is, in order to increase the transfer yield, the assembly substrate is placed on the upper portion to minimize the influence of gravity or frictional force and prevent non-specific binding.

As described above, according to the present disclosure having the foregoing configuration, a large number of semiconductor light-emitting devices may be assembled at one time in a display device (display apparatus) in which individual pixels are formed with semiconductor light-emitting devices.

As described above, according to the present disclosure, a large number of semiconductor light-emitting devices may be pixelated on a wafer having a small size, and then transferred onto a large-area substrate. Through this, it may be possible to fabricate a large-area display device (display apparatus) at a low cost.

On the other hand, as described above, the semiconductor light-emitting device used for self-assembly includes a horizontal type and a vertical type. In the horizontal type semiconductor light-emitting device, since first and second conductive electrodes are formed on the same surface of a specific semiconductor layer, it may be possible to form a wiring electrode electrically connected to the first and second conductive electrodes of the semiconductor light-emitting device on a substrate on which the semiconductor light-emitting device is placed subsequent to self-assembly.

However, in the vertical type semiconductor light-emitting device, since first and second conductive type electrodes are formed on different surfaces of a specific semiconductor layer, it may be impossible to form a wiring electrode electrically connected to the first and second conductive electrodes of the semiconductor light-emitting device in a state where the semiconductor light-emitting device is placed on a substrate subsequent to self-assembly. Therefore, in this case, self-assembly is performed after forming in advance a wiring electrode electrically connected to the first or the second conductive electrode of the semiconductor light-emitting device on the substrate, and then a process of forming a wiring electrode electrically connected to the remaining electrode of the semiconductor light-emitting device is carried out.

Figure 10:
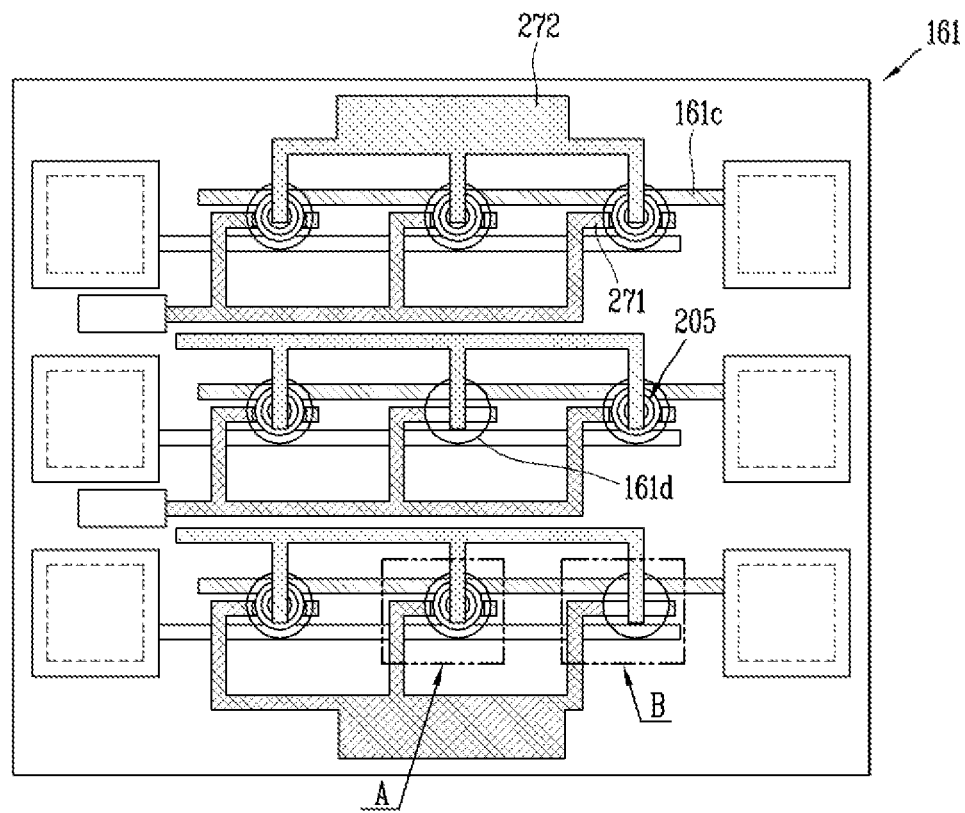
FIG. 10 is a conceptual view showing a schematic structure of a display device (display apparatus) in the related art.
Figure 11:
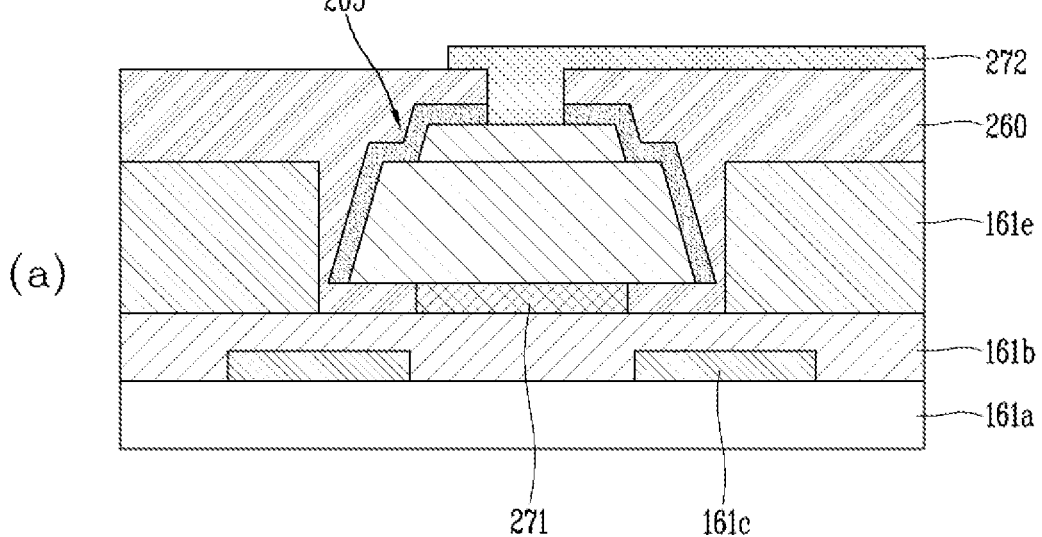
FIG. 11 is a cross-sectional view of regions A and B in FIG. 10.
Figure 11:
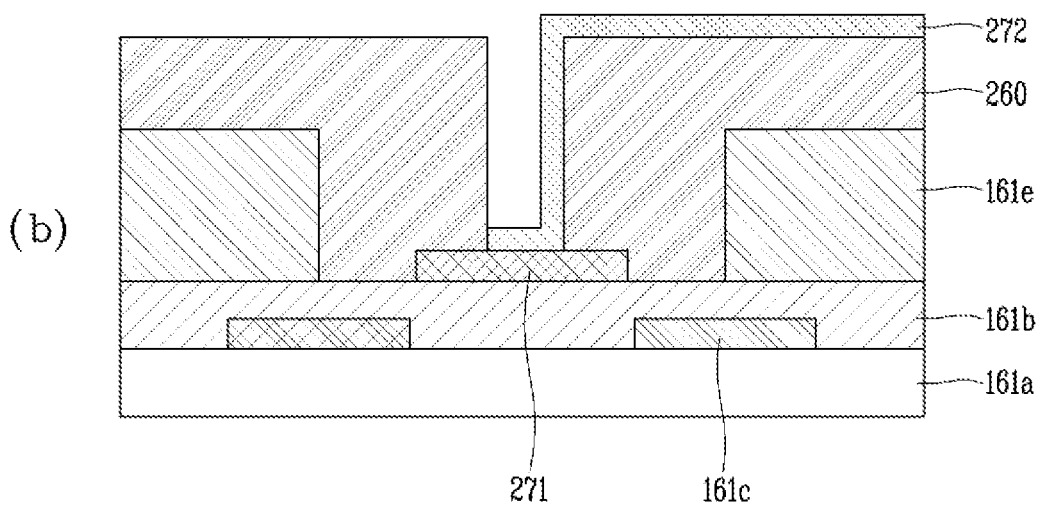

FIG. 10 is a conceptual view showing a schematic structure of a display device (display apparatus) in the related art, and FIG. 11 is a cross-sectional view of regions A and B in FIG. 10.

Although the self-assembly process shows an assembly rate close to 100%, there may exist a region in which the semiconductor light-emitting device 205 is not assembled (region B in FIG. 10) at a very low probability. In this case, a wiring electrode 272 formed subsequent to self-assembly in the unassembled area and a wiring electrode 271 previously formed on the substrate are connected to each other to cause a short. The occurrence of a short has caused a turn-on failure for all semiconductor light-emitting devices 205 connected to the relevant wiring electrodes 271, 272 and a resultant decrease in luminance.

Hereinafter, a display device (display apparatus) having a new structure according to the present disclosure for solving the above-described problems will be described.

The present disclosure relates to a display device (display apparatus) having a high light-emitting efficiency, and discloses a structure in which a short does not occur between wiring electrodes even when there is a region where a semiconductor light-emitting device is not assembled.

Hereinafter, a display device (display apparatus) driven by a passive matrix (PM) method will be described, but may also be driven by an active matrix (AM) method.

Figure 12:
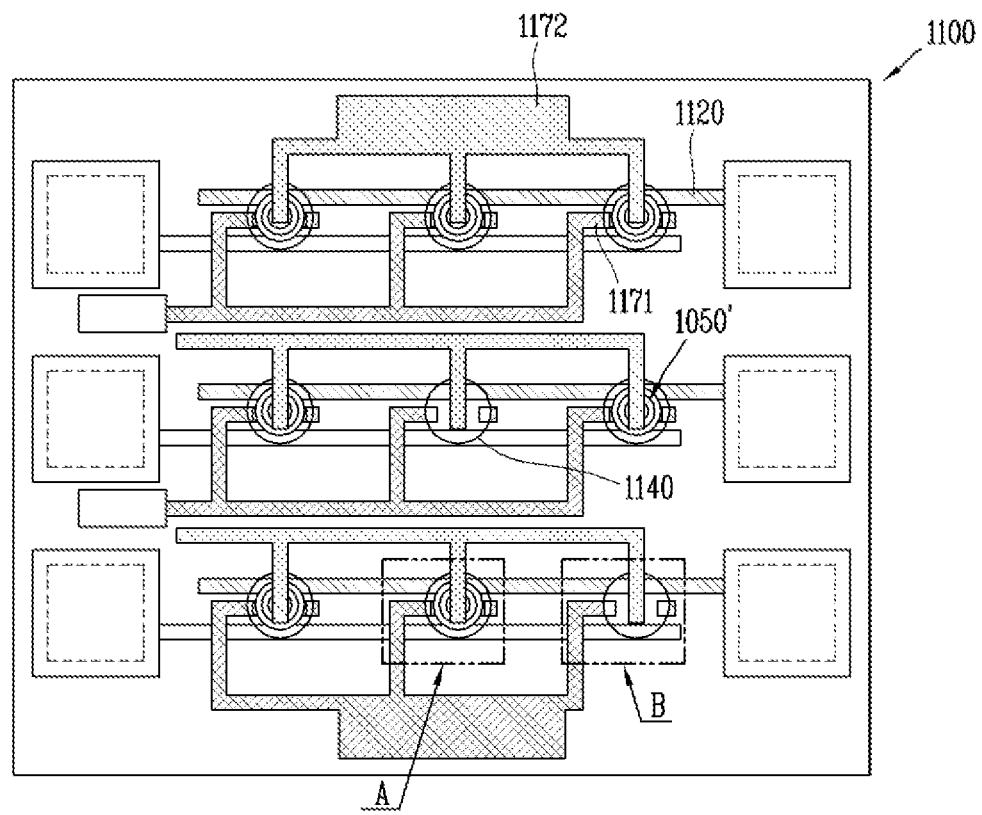
FIG. 12 is a conceptual view showing a schematic structure of a display device (display apparatus) according to the present disclosure.
Figure 13:
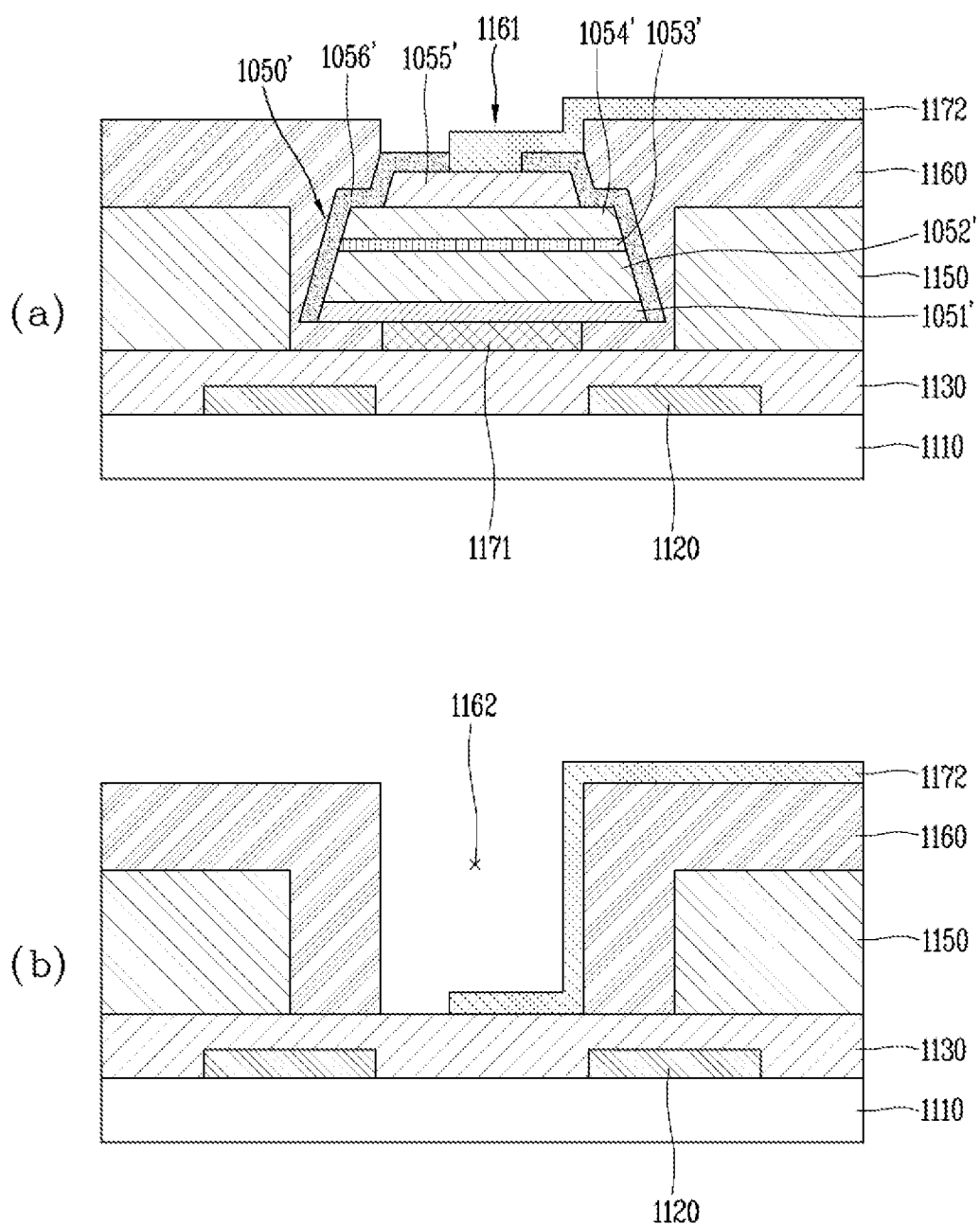
FIG. 13 is a view showing cross-sections of regions A and B in FIG. 12 according to an embodiment of the present disclosure.
Figure 16:
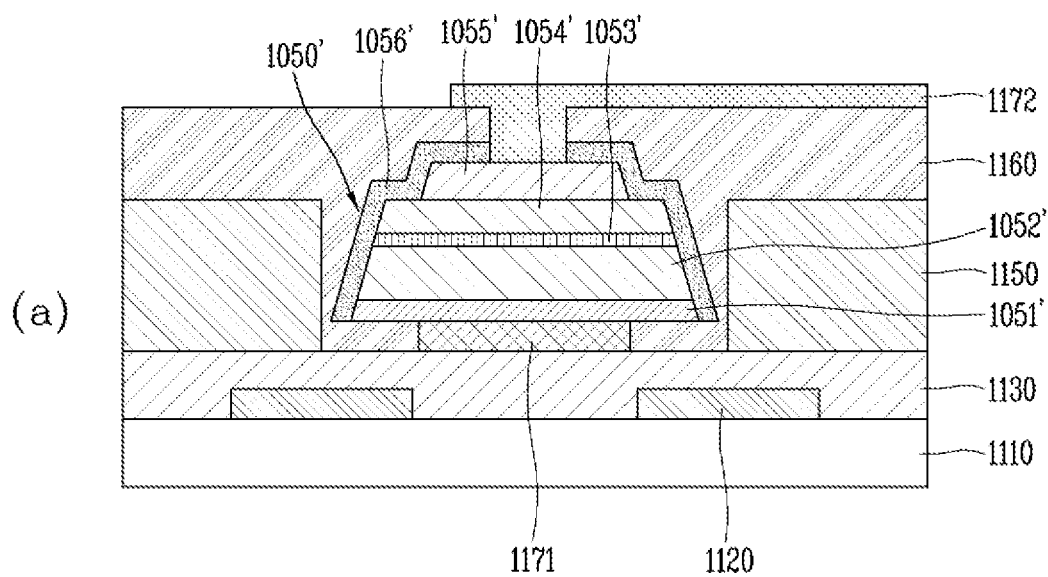
FIG. 16 is a view showing cross-sections of the regions A and B in FIG. 12 according to another embodiment of present disclosure.
Figure 16:
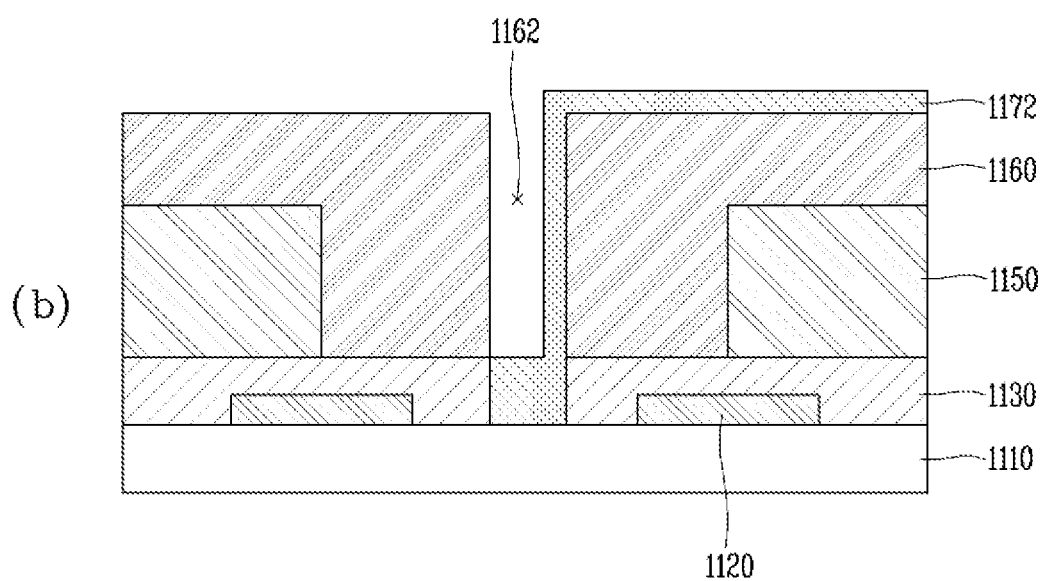
Figure 18:
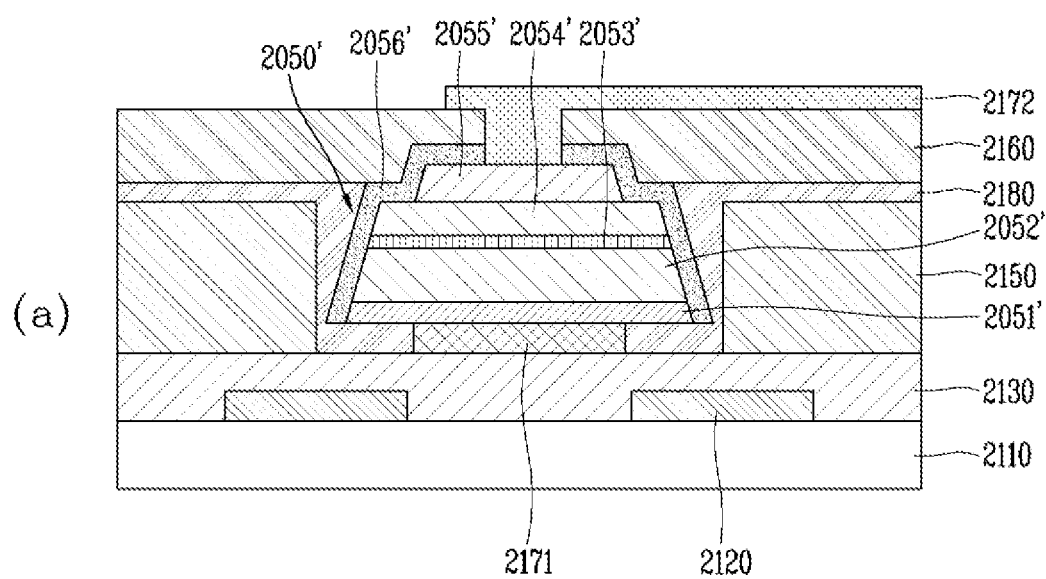
FIG. 18 is a view showing cross-sections of the regions A and B in FIG. 12 according to still another embodiment of present disclosure.
Figure 18:
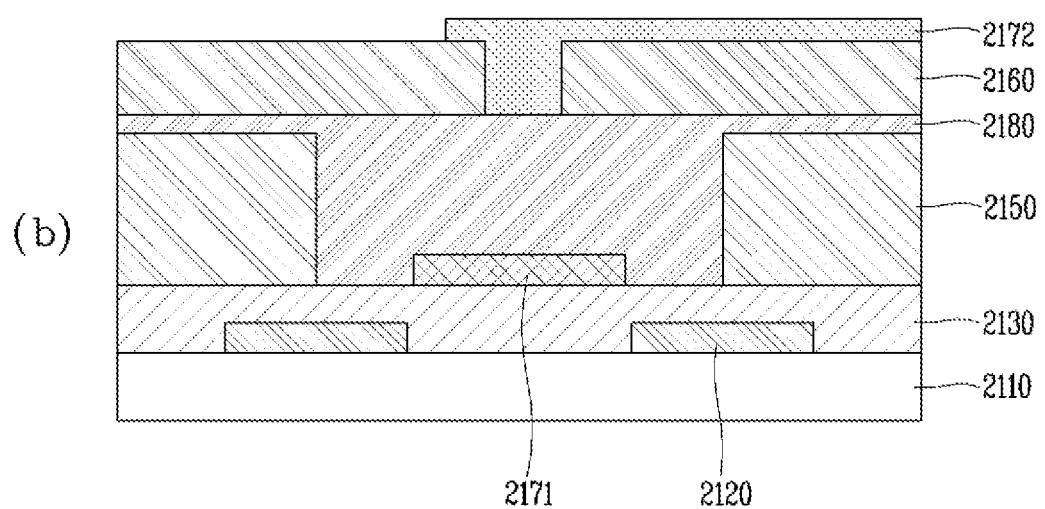

FIG. 12 is a conceptual view showing a schematic structure of a display device (display apparatus) according to the present disclosure, and FIG. 13 is a cross-sectional view of regions A and B in FIG. 12 according to an embodiment of the present disclosure. FIG. 16 is a view showing cross-sections of the region A and B in FIG. 12 according to another embodiment of the present disclosure, and FIG. 18 is a view showing cross-sections of the regions A and B in FIG. 12 according to still another embodiment of the present disclosure.

A display device (display apparatus) 1000 according to the present disclosure includes semiconductor light-emitting devices 1050' and a substrate 1100 in which the semiconductor light-emitting devices 1050' are accommodated. The substrate 1100 includes a wiring electrode 1170 electrically connected to the semiconductor light-emitting devices 1050'. Furthermore, the substrate 1100 includes a base portion 1110, assembly electrodes 1120, a dielectric layer 1130, a partition wall portion 1150, and a planarization layer 1160, and the wiring electrode 1170 is a lower wiring electrode 1171 and an upper wiring electrode 1172.

The base portion 1110 may be a base layer on which a structure is formed through an entire process. The base portion 1110 may include sapphire, glass, silicon, or the like, or may include polyimide (PI) to implement flexibility. In addition, any insulating and flexible material such as polyethylene naphthalate (PEN) or polyethylene terephthalate (PET) may be used. Furthermore, the base portion 1110 may be made of a transparent material or a non-transparent material.

The assembly electrodes 1120 may be line-shaped electrodes extending in one direction. The assembly electrodes 1120 may be configured with a plurality of lines and disposed on the base portion 1110 at predetermined intervals. Two adjacent assembly electrodes 1120 among the assembly electrodes 1120 may form pair electrodes.

A voltage signal for forming an electric field in the substrate 1100 is applied to the assembly electrodes 1120. Accordingly, the assembled electrodes 1120 may be formed of a resistive metal such as Al, Mo, Cu, Ag, Ti, or the like or an alloy selected from these metals.

The assembly electrodes 1120 may be patterned at predetermined intervals on the base portion 1110 by depositing the metal material through sputtering on the base portion 1110, forming a PR pattern, and then removing an area in which the PR pattern is not formed. An interval between the assembled electrodes 1120 may be several to several tens of µm. The remaining PR pattern may be removed through an ashing process. However, a method of forming the assembly electrodes 1120 is not limited thereto.

The dielectric layer 1130 may be formed to cover the assembly electrodes 1120. The dielectric layer 1130 constitutes a bottom surface of the cell 1140 on which the semiconductor light-emitting device 1050' is placed, and electrically insulates the semiconductor light-emitting device 1050' from the assembly electrodes 1120. The dielectric layer 1130 may be made of an inorganic material, such as $SiO_2$, SiNx, $Al_2O_3$, $TiO_2$, $HfO_2$, which has excellent insulating properties and low light absorption.

According to the present disclosure, the lower wiring electrode 1171 may be formed on the dielectric layer 1130. The lower wiring electrode 1171 may be formed of an element selected from Sn, In, Pb, Cd, Bi, Zn, and the like, or an element having a melting point similar thereto, or a compound of elements.

The lower wiring electrode 1171 may include a portion extending in the same direction as the assembly electrodes 1120. The lower wiring electrode 1171 described below may refer to a portion extending in the same direction as the assembly electrodes 1120.

The lower wiring electrode 1171 may be disposed between pair electrodes. This is because, when the lower wiring electrode 1171 is formed to overlap the assembly electrodes 1120, an electric field formed by the assembly electrode 1120 may be shielded to prevent the self-assembly of the semiconductor light-emitting device 1050'.

The partition wall portion 1150 may be formed on the dielectric layer 1130 while forming the cell 1140 on which the semiconductor light-emitting devices 1050' are placed. The cells 1140 may be formed along an extension direction of the assembly electrodes 1120 and may be disposed in a matrix arrangement (a plurality of rows and columns) as a whole.

The cell 1140 may overlap two adjacent assembly electrodes 1120, particularly, pair electrodes at the same time. Therefore, when a voltage signal is applied to the assembly electrodes 1120, an electric field may be strongly formed inside the cell 1140.

The partition wall portion 1150 may be formed of an insulating material. For example, the partition wall portion 1150 may be formed of a polymer material such as PAC or PI or an inorganic material such as $SiO_2$ or SiNx. The partition wall portion 1150 may be formed at a thickness of several μm. The partition wall portion 1150 may be formed on the dielectric layer 1130 while forming the cell 1140 through exposure and development after forming an insulating material on an entire surface of the dielectric layer 1130 and forming a PR pattern (Positive PR), and the remaining PR pattern may be removed through an ashing process.

The substrate 1100 may be transferred to an assembly position for self-assembly in a state in which the assembly electrodes 1120, the dielectric layer 1130, the lower wiring electrode 1171, and the partition wall portion 1150 are formed on the base portion 1110, and through self-assembly, the semiconductor light-emitting devices 1050' may be placed into the cell 1140 formed by the partition wall portion 1150.

According to the present disclosure, the vertical semiconductor light-emitting device 1050' may be placed on the substrate 1100 through self-assembly. The vertical semiconductor light-emitting device 1050' includes a first conductive electrode 1051', a first conductive semiconductor layer 1052' formed on the first conductive electrode 1051', an active layer 1053' formed on the first conductive semiconductor layer 1052', a second conductive semiconductor layer 1054' formed on the active layer 1053', and a second conductive electrode 1055' formed on the second conductive semiconductor layer 1054'.

That is, in the vertical semiconductor light-emitting device 1050', the first conductive electrode 1051' and the second conductive electrode 1055' are formed on different surfaces of the first conductive semiconductor layer 1052', and thus has an advantage of having a structure that is advantageous for manufacturing a semiconductor light-emitting device in a small size while having a wider light-emitting area compared to the horizontal semiconductor light-emitting device. Furthermore, high resolution may be implemented by reducing a size of the semiconductor light-emitting device.

In addition, the semiconductor light-emitting device 1050' according to the present disclosure includes a passivation layer 1056' formed to cover a side surface of the semiconductor light-emitting device 1050' and a portion of the second conductive electrode 1055'. All or a portion of the first and second conductive electrodes 1051', 1055' may be exposed for electrical connection to the wiring electrode 1170.

For example, an entirety of the first conductive electrode 1051' may be exposed and may be electrically connected to the lower wiring electrode 1171 inside the cell 1140. Here, the first conductive electrode 1051' may be an electrode for ohmic contact. A portion of the second conductive electrode 1055' may be exposed and may be electrically connected to the upper wiring electrode 1172, which will be described later. In particular, a structure in which a portion of the second conductive electrode 1055' is exposed may be a structure formed by removing a portion of the passivation layer 1056' during a wiring process. Meanwhile, in this structure, since light generated from the active layer 1053' is emitted through a surface on which the second conductive electrode 1055' is formed, the second conductive electrode 1055' may be a transparent electrode having a light transmittance.

Furthermore, the semiconductor light-emitting device 1050' according to the present disclosure may be a symmetrical vertical semiconductor light-emitting device 1050'. The symmetrical semiconductor light-emitting device 1050' may be uniformly placed inside the cell 1140, no matter what direction it is placed. In addition, the semiconductor light-emitting device 1050' according to the present disclosure may include a magnetic body (not shown) in the first and/or second conductive electrodes 1051', 1055' so as to be guided and moved by a magnetic field during self-assembly. Other descriptions of the structure and materials of the semiconductor light-emitting device 1050' are replaced with the above descriptions.

On the other hand, the lower wiring electrode 1171 may be formed to overlap the cell 1140 so as to be in contact with the semiconductor light-emitting device 1050' placed on the cell 1140 in a region where the cell 1140 is formed, or may be disconnected so as not to overlap the cell 1140 in the region where the cell 1140 is formed. The lower wiring electrode 1171 overlapping the cell 1140 may be electrically connected to the semiconductor light-emitting device 1050' through soldering. Meanwhile, a structure in which the lower wiring electrode 1171 is disconnected so as not to overlap the cell 1140 in the region where the cell 1140 is formed may be a structure for a region where the semiconductor light-emitting device 1050' is not assembled.

The planarization layer 1160 may be formed on the partition wall portion 1150 to cover the semiconductor light-emitting devices 1050' placed on the cell 1140 while forming a hole 1161, 1162 to overlap the cell 1140. The planarization layer 1160 may be formed on the substrate 1100 after the semiconductor light-emitting device 1050' is placed on the cell 1140 through self-assembly. The planarization layer 1160 may fill into the cell 1140 while covering the partition wall portion 1150, and the semiconductor light-emitting device 1050' may be fixed to an inside of the cell 1140. Furthermore, the planarization layer 1160 may be formed of a light-transmitting insulating material.

According to the embodiments shown in FIGS. 13 and 16, the planarization layer 1160 may include a first hole 1161 exposing the semiconductor light-emitting device 1050' placed on the cell 1140, and a second hole 1162 exposing the dielectric layer 1130 or the base portion 1110. That is, the first hole 1161 is a hole that overlaps the cell 1140 on which the semiconductor light-emitting device 1050' is placed, and the second hole 1162 corresponds to a hole that overlaps the cell 1140 in which the semiconductor light-emitting device 1050' is not assembled. Accordingly, only a small portion of the second hole 1162 may exist. Furthermore, the first hole 1161 and the second hole 1162 are not formed at predetermined positions or coordinates, but may be determined by self-assembly.

In addition, the first hole 1161 and the second hole 1162 may be formed to be thicker in a width direction than the lower wiring electrode 1171. However, this is limited to a case according to a specific manufacturing method, the details will be described later.

The upper wiring electrode 1172 may be formed on the planarization layer 1160. The upper wiring electrode 1171 may extend to the semiconductor light-emitting device 1050' placed on the cell 1140 through the first hole 1161, or may extend to the dielectric layer 1130 or the base portion 1110 through the second hole 1162.

Here, the upper wiring electrode 1172 extending from the planarization layer 1160 to the semiconductor light-emitting device 1050' through the first hole 1161 may be electrically connected to the second conductive electrode 1055' of the semiconductor light-emitting device 1050'. The upper wiring electrode 1172 may be formed of a light-transmitting material in order to maximize a light-emitting area, but is not limited thereto. Furthermore, in a region of the cell 1140, the lower wiring electrode 1171 and the upper wiring electrode 1172 may overlap to cross each other.

In addition, although the upper wiring electrode 1172 extends to the dielectric layer 1130 or the base 1110 through the second hole 1162, the lower wiring electrode 1171 may be disconnected so as not to exist in a region where the semiconductor light-emitting device 1050' is not assembled, and thus a short may not occur because the lower wiring electrode 1171 and the upper wiring electrode 1172 are not connected even when the process of forming the upper wiring electrode 1172 on an entire surface of the substrate 1100 is carried out.

Hereinafter, another embodiment of a display device (display apparatus) according to the present disclosure will be described.

FIG. 18 is a view showing cross-sections of the regions A and B in FIG. 12 according to still another embodiment of present disclosure.

Referring to FIG. 18, a display device (display apparatus) 2000 includes semiconductor light-emitting devices 2050' and a substrate 2100 in which the semiconductor light-emitting devices 2050' are accommodated similar to the above-described example. The substrate 2100 includes a wiring electrode 2170 electrically connected to the semiconductor light-emitting devices 2050'. Furthermore, the substrate 2100 includes a base portion 2110, assembly electrodes 2120, a dielectric layer 2130, a partition wall portion 2150, and a planarization layer 2160, and the wiring electrode 2170 is a lower wiring electrode 2171 and an upper wiring electrode 2172.

According to the present embodiment, the display device (display apparatus) 2000 further includes an organic layer 2180 formed to fill into the cell 2140. That is, in the present embodiment, an inside of the cell 2140 is not filled by the planarization layer 2160, and the planarization layer 2160 may be formed on the organic layer 2180.

According to the present embodiment, the planarization layer 2160 may include a first hole 2161 exposing the semiconductor light-emitting device 2050' placed on the cell 2140, and a second hole 2162 exposing the organic layer 2180. That is, the first hole 2161 is a hole that overlaps the cell 2140 on which the semiconductor light-emitting device 2050' is placed, and the second hole 2162 corresponds to a hole that overlaps the cell 2140 in which the semiconductor light-emitting device 1050' is not assembled. Accordingly, only a small portion of the second hole 2162 may exist. Furthermore, the first hole 2161 and the second hole 2162 are not formed at predetermined positions or coordinates, but may be determined by self-assembly.

According to the present embodiment, since an inside of the cell 2140 is filled by the organic layer 2180, it does not have a structure in which the lower wiring electrode 2171 is disconnected in a region where the semiconductor light-emitting device 2050' is not assembled. In addition, according to the present embodiment, the upper wiring electrode 2172 formed on the planarization layer 2160 may extend to the semiconductor light-emitting device 2050' through the first hole 2161 or may extend to the organic layer 2180 through the second hole 2162.

Here, the upper wiring electrode 2172 extending from the planarization layer 2160 to the semiconductor light-emitting device 2050' through the first hole 2161 may be electrically connected to the second conductive electrode 2055' of the semiconductor light-emitting device 2050'. The upper wiring electrode 2172 may be formed of a light-transmitting material in order to maximize a light-emitting area, but is not limited thereto. Furthermore, in a region of the cell 2140, the lower wiring electrode 2171 and the upper wiring electrode 2172 may overlap to cross each other.

In addition, since the upper wiring electrode 2172 extends to the organic layer 2180 through the second hole 2162, it has a structure that is not connected to the lower wiring electrode 2171, and thus prepares for a short.

Hereinafter, a method of manufacturing a display device (display apparatus) according to each of the embodiments shown in FIGS. 13, 16 and 18 will be described.

Figure 14A:
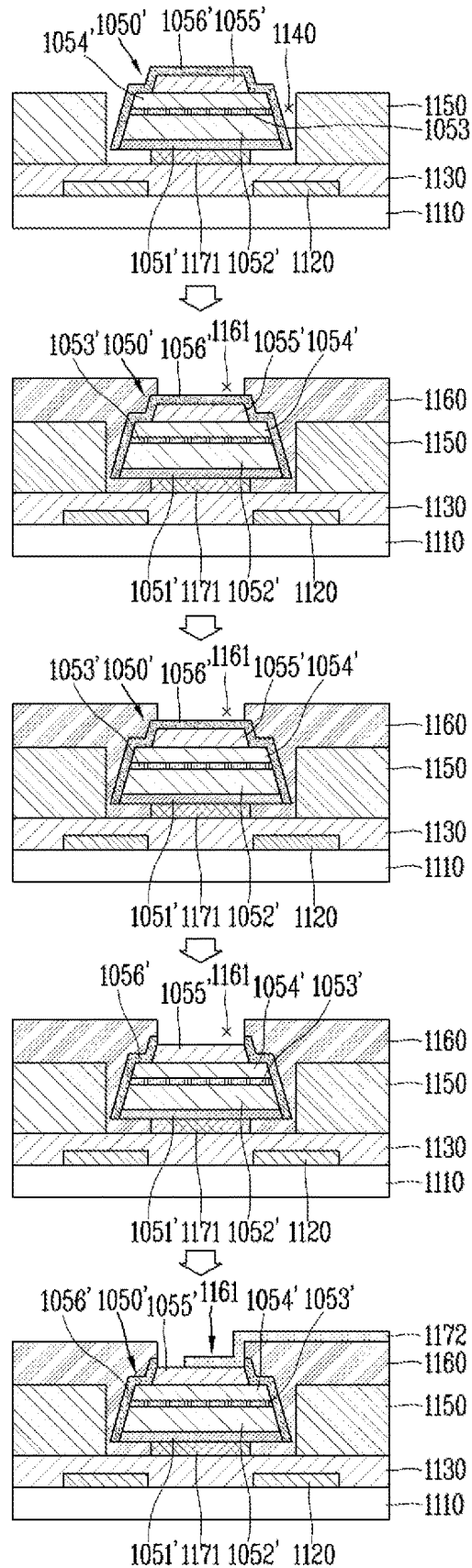
FIGS. 14A (assembly region), 14B (non-assembly region), and 15 are conceptual views showing a process of manufacturing a display device (display apparatus) having a structure according to FIG. 13.
Figure 14B:
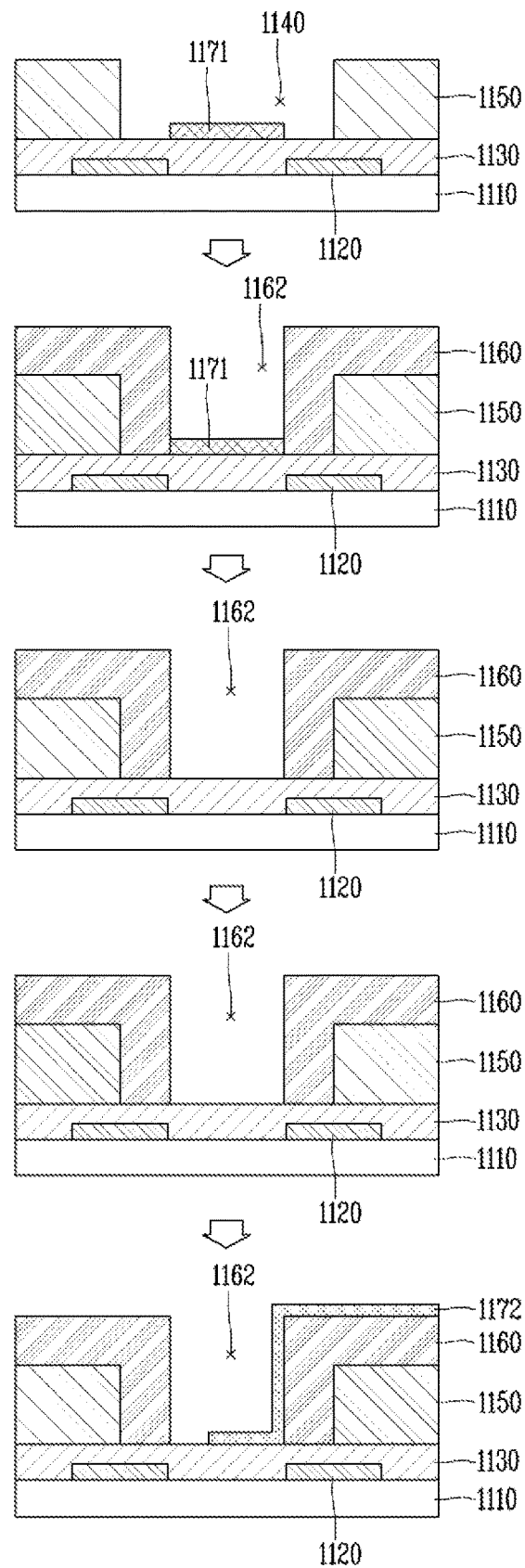
Figure 15:
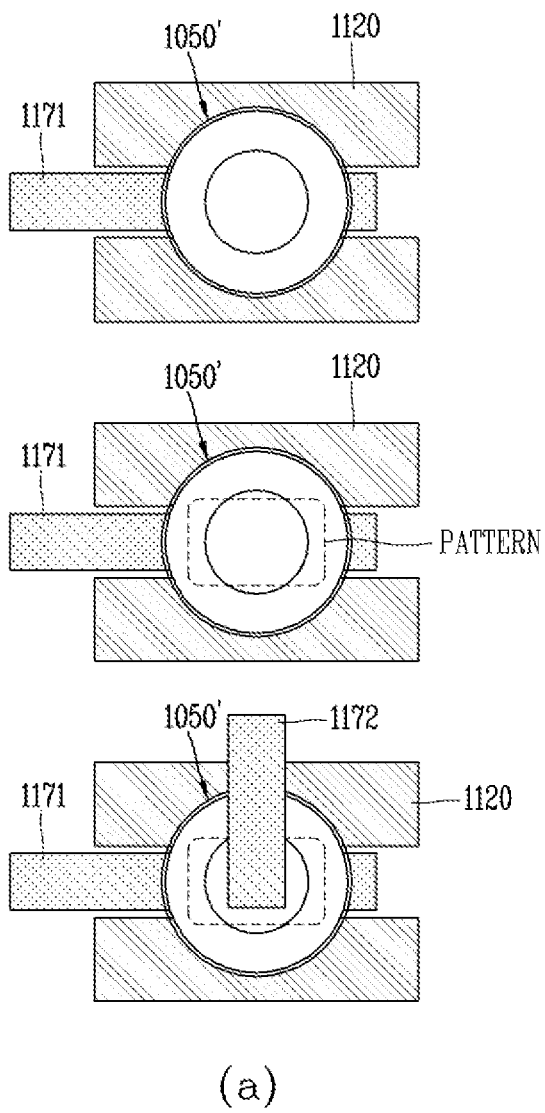
Figure 15:
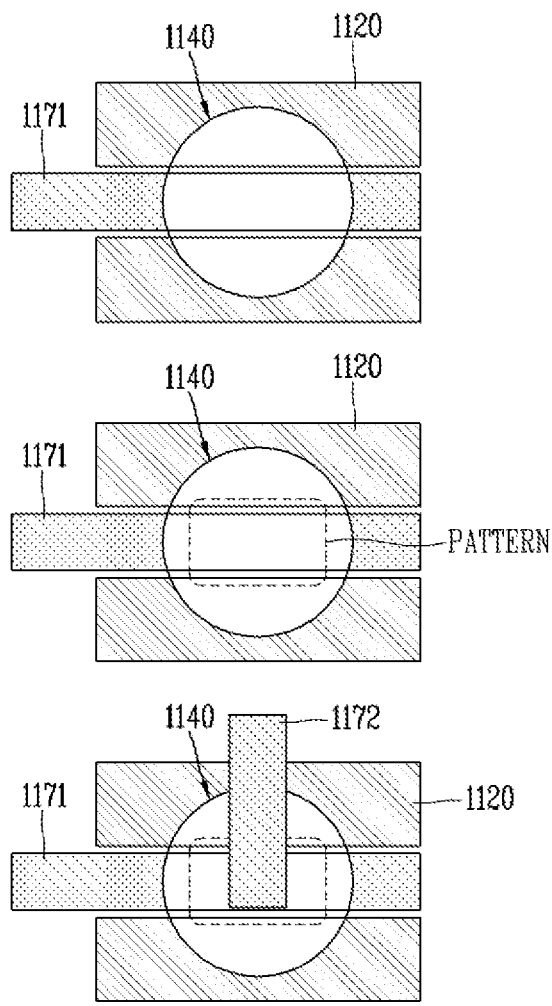

First, a method of manufacturing a display device (display apparatus) according to the embodiment shown in FIG. 13 will be described with reference to FIGS. 14 and 15. FIGS. 14A (assembly region), 14B (non-assembly region), and 15 are conceptual views showing a process of manufacturing a display device (display apparatus) having a structure according to FIG. 13.

First, a step of forming the assembly electrodes 1120 extending in one direction on the base portion 1110 may be performed. The assembly electrodes 1120 may be patterned on the base portion 1110 by depositing the metal material through sputtering on the base portion 1110, forming a PR pattern, and then etching an area in which the PR pattern is not formed. Next, a step of forming the dielectric layer 1130 to cover the assembly electrodes 1120 may be performed. Then, the remaining PR pattern may be removed through an ashing process. However, a method of forming the assembly electrodes 1120 is not limited thereto.

Next, a step of forming the dielectric layer 1130 to cover the assembly electrodes 1120 may be performed. The dielectric layer 1130 may be formed by depositing an inorganic material such as $SiO_2$, SiNx, $Al_2O_3$, $TiO_2$, $HfO_2$ on the base portion 1110.

Next, a step of forming the lower wiring electrode 1171 on the dielectric layer 1130 may be performed. The lower wiring electrode 1171 may include a portion extending in the same direction as the assembly electrodes 1120. A portion of the lower wiring electrode 1171 extending in the same direction as the assembly electrodes 1120 may be formed to be disposed between two adjacent assembly electrodes 1120, particularly, pair electrodes. The lower wiring electrode 1171 may be patterned on the dielectric layer 1130 in the same manner as the assembly electrodes 1120.

Next, a step of forming the partition wall portion 1150 may be performed while forming the cell 1140 in which the semiconductor light-emitting device 1050' is placed on the dielectric layer 1130. Specifically, the cell 1140 may be formed through a photolithography process after depositing an insulating polymer material or an inorganic material that forms the partition wall portion 1150 on the dielectric layer 1130 and forming a PR pattern thereon. The remaining PR pattern may be removed through an ashing process. Meanwhile, the cells 1140 may be formed along an extension direction of the assembly electrodes 1120 and may be disposed in a matrix arrangement as a whole. Furthermore, the cell 1140 may overlap pair electrodes and the lower wiring electrode 1171 disposed between the pair electrodes.

Next, a step of placing the semiconductor light-emitting device 1050' on the cell 1140 may be performed, and this step may be performed by a self-assembly method. The self-assembly method performed in this step is replaced with the above description of FIGS. 8A to 8E. In addition, the semiconductor light-emitting device 1050' placed on the cell 1140 through self-assembly in this step may be a vertical semiconductor light-emitting device.

When self-assembly is completed, a step of fixing the semiconductor light-emitting device 1050' to the substrate 1100 may be performed. In an embodiment, after forming a mask pattern on the partition wall portion 1150, a process of applying an adhesive material to an inside of the cell 1140 on which the semiconductor light-emitting device 1050' is placed may be performed.

Next, a step of forming the planarization layer 1160 to cover the partition wall portion 1150 while forming the hole 1161, 1162 to overlap the cell 1140 may be performed.

In this step, first, a step of depositing the planarization layer 1160 on the partition wall portion 1150 to cover the semiconductor light-emitting device 1050' placed on the cell 1140 may be performed. Here, the planarization layer 1160 may be deposited while filling into the cell 1140. The planarization layer 1160 may be formed of a polymer material such as PAC or PI. However, the material of the planarization layer 1160 is not limited thereto as long as it is an insulating and flexible transparent material.

Next, a step of forming the hole 1161, 1162 on the planarization layer 1160 may be performed. Specifically, the hole 1161, 1162 may be formed through a process of etching after depositing a mask pattern for forming the hole 1161, 1162 that overlaps the cell 1140 on the planarization layer 1160. The mask pattern may be deposited in a region other than a region in which the hole 1161, 1162 is to be formed.

The hole 1161, 1162 may be formed to overlap the cell 1140. When the semiconductor light-emitting device 1050' is placed on the cell 1140, a portion of the semiconductor light-emitting device 1050' is exposed through the hole 1161, and the hole for exposing the semiconductor light-emitting device 1050' is referred to as a first hole 1161. On the contrary, when the semiconductor light-emitting device 1050' is not placed inside the cell 1140, the dielectric layer 1130 or the base portion 1110 may be exposed through the hole 1162, and the hole for exposing the dielectric layer 1130 or the base portion 1110 is referred to as a second hole 1162. Here, a portion of the lower wiring electrode 1171 formed on the dielectric layer 1130 may also be exposed through the second hole 1162.

Next, a step of etching the lower wiring electrode 1171 exposed through the second hole 1162 may be performed. In this case, an etchant capable of selectively etching only a metal material forming the lower wiring electrode 1171 may be used.

This step is to prevent a short from occurring due to an electrical connection between the upper wiring electrode 1172 and the lower wiring electrode 1171 as the semiconductor light-emitting device 1050' is not assembled in the cell 1140 in the process of forming the upper wiring electrode 1172 on an entire surface of the substrate 1100 afterward.

Therefore, the mask pattern for forming the hole 1161, 1162 in the previous step may be formed to have the same thickness in a width direction as that of the lower wiring electrode 1171 or to be thicker in the width direction than the lower wiring electrode 1171. This is to remove all portions overlapping the cell 1140 of the lower wiring electrode 1171.

Finally, a step of forming the upper wiring electrode 1172 on the planarization layer 1160 may be performed. The process of forming the upper wiring electrode 1172 may be performed on an entire surface of the substrate 1100. The upper wiring electrode 1172 may extend to the semiconductor light-emitting device 1050' through the first hole 1160 on the planarization layer 1160, or may extend to the dielectric layer 1130 or the base portion 1110 through the second hole 1162.

Meanwhile, a process of etching a portion of the passivation layer 1056' to expose a portion of the second conductive electrode 1055' of the semiconductor light-emitting device 1050' may be carried out prior to the step of forming the upper wiring electrode 1172 to electrically connect the semiconductor light-emitting device 1050' and the upper wiring electrode 1172.

Figure 17A:
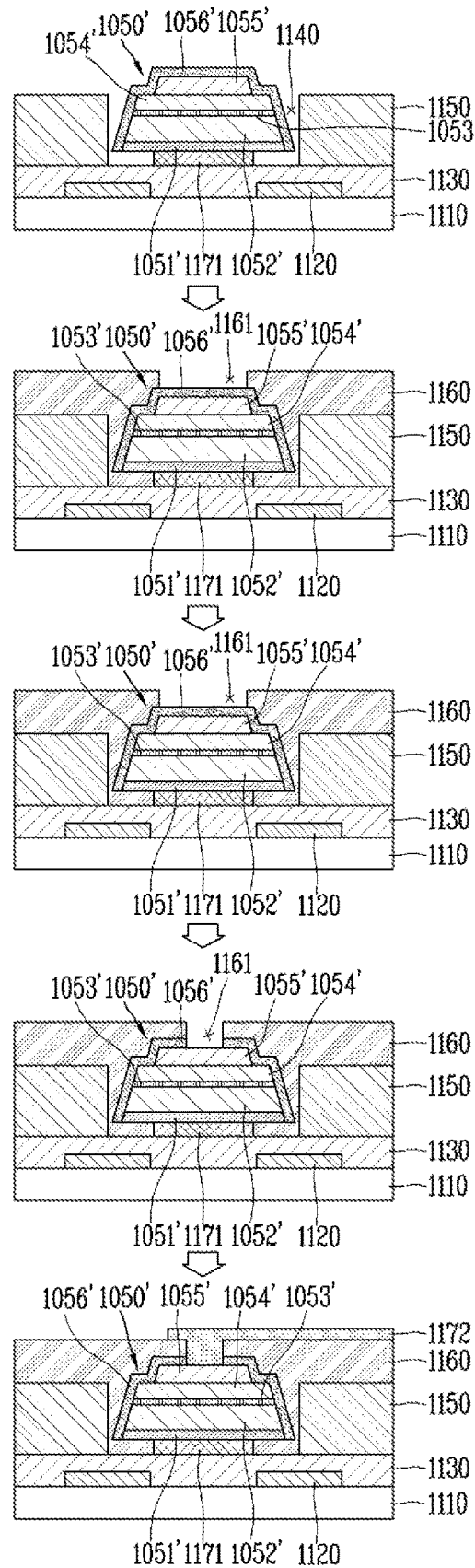
FIGS. 17A (assembly region) and 17B (non-assembly region) are conceptual views showing a process of manufacturing a display device (display apparatus) having a structure according to FIG. 16.
Figure 17B:
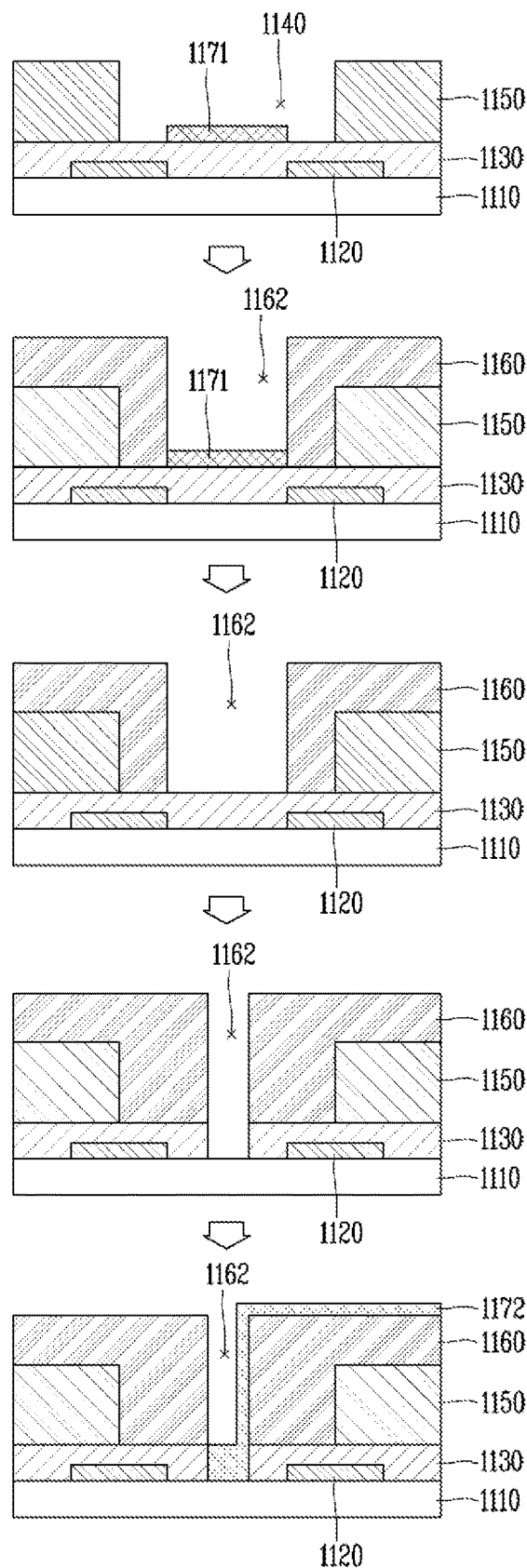

Next, a method of manufacturing a display device (display apparatus) according to the embodiment shown in FIG. 16 will be described with reference to FIG. 17. FIGS. 17A (assembly region) and 17B (non-assembly region) are conceptual views showing a process of manufacturing a display device (display apparatus) having a structure according to FIG. 16.

In this embodiment, the steps of placing the semiconductor light-emitting device 1050' on the cell 1140 through self-assembly and fixing the semiconductor light-emitting device 1050' to the substrate 1100 are the same as in the above-described embodiment, and thus a detailed description will be omitted.

This embodiment is characterized in that a pattern for removing the lower wiring electrode 1171 and a pattern for forming the hole 1161, 1162 are respectively formed.

Specifically, a step of depositing a PR on the partition wall portion 1150 to cover the semiconductor light-emitting device 1050' placed on the cell 1140 subsequent to self-assembly may be performed. Next, after aligning the mask pattern, a pattern for removing the lower wiring electrode 1171 is formed through exposure and development (Negative PR).

A pattern formed through the above process may be formed to have the same thickness in a width direction as that of the lower wiring electrode 1171 or to be thicker in the width direction than the lower wiring electrode 1171. This is to remove all portions overlapping the cell 1140 of the lower wiring electrode 1171.

Next, a step of etching the lower wiring electrode 1171 exposed through the pattern may be performed. In this case, an etchant capable of selectively etching only a metal material forming the lower wiring electrode 1171 may be used.

This step is to prevent a short from occurring due to an electrical connection between the upper wiring electrode 1172 and the lower wiring electrode 1171 as the semiconductor light-emitting device 1050' is not assembled in the cell 1140 in the process of forming the upper wiring electrode 1172 on an entire surface of the substrate 1100 afterward.

Next, a step of removing the PR from the substrate 1100, and forming the planarization layer 1160 to cover the partition wall portion 1150 while forming the hole 1161, 1162 to overlap the cell 1140 may be performed.

The planarization layer 1160 may be formed subsequent to removing the PR, and the PR may be removed through a PR strip process.

Next, a step of depositing the planarization layer 1160 on the partition wall portion 1150 to cover the semiconductor light-emitting device 1050' placed on the cell 1140 may be performed. Here, the planarization layer 1160 may be deposited while filling into the cell 1140. The planarization layer 1160 may be formed of a polymer material such as PAC or PI. However, the material of the planarization layer 1160 is not limited thereto as long as it is an insulating and flexible transparent material.

Next, a step of forming the hole 1161, 1162 on the planarization layer 1160 may be performed. Specifically, the hole 1161, 1162 may be formed through a process of etching after depositing a mask pattern for forming the hole 1161, 1162 that overlaps the cell 1140 on the planarization layer 1160. The mask pattern may be deposited in a region other than a region in which the hole 1161, 1162 is to be formed.

The hole 1161, 1162 may be formed to overlap the cell 1140. When the semiconductor light-emitting device 1050' is placed on the cell 1140, a portion of the semiconductor light-emitting device 1050' is exposed through the hole 1161, and the hole for exposing the semiconductor light-emitting device 1050' is referred to as a first hole 1161. On the contrary, when the semiconductor light-emitting device 1050' is not placed inside the cell 1140, the dielectric layer 1130 or the base portion 1110 may be exposed through the hole 1162, and the hole for exposing the dielectric layer 1130 or the base portion 1110 is referred to as a second hole 1162.

According to the present embodiment, since the step of etching the lower wiring electrode 1171 is performed prior to forming the hole 1161, 1162, a width of the pattern for forming the hole 1161, 1162 is not necessary to be formed to be the same as that of the lower wiring electrode 1171 or to be greater than that of the lower wiring electrode 1171.

Finally, a step of forming the upper wiring electrode 1172 on the planarization layer 1160 may be performed. The process of forming the upper wiring electrode 1172 may be performed on an entire surface of the substrate 1100. The upper wiring electrode 1172 may extend to the semiconductor light-emitting device 1050' through the first hole 1160 on the planarization layer 1160, or may extend to the dielectric layer 1130 or the base portion 1110 through the second hole 1162.

Meanwhile, a process of etching a portion of the passivation layer 1056' to expose a portion of the second conductive electrode 1055' of the semiconductor light-emitting device 1050' may be carried out prior to the step of forming the upper wiring electrode 1172 to electrically connect the semiconductor light-emitting device 1050' and the upper wiring electrode 1172.

A display device (display apparatus) manufactured through a manufacturing method according to the present embodiment has the same final structure as the above-described embodiment except for a size of the hole 1161, 1162.

Figure 19A:
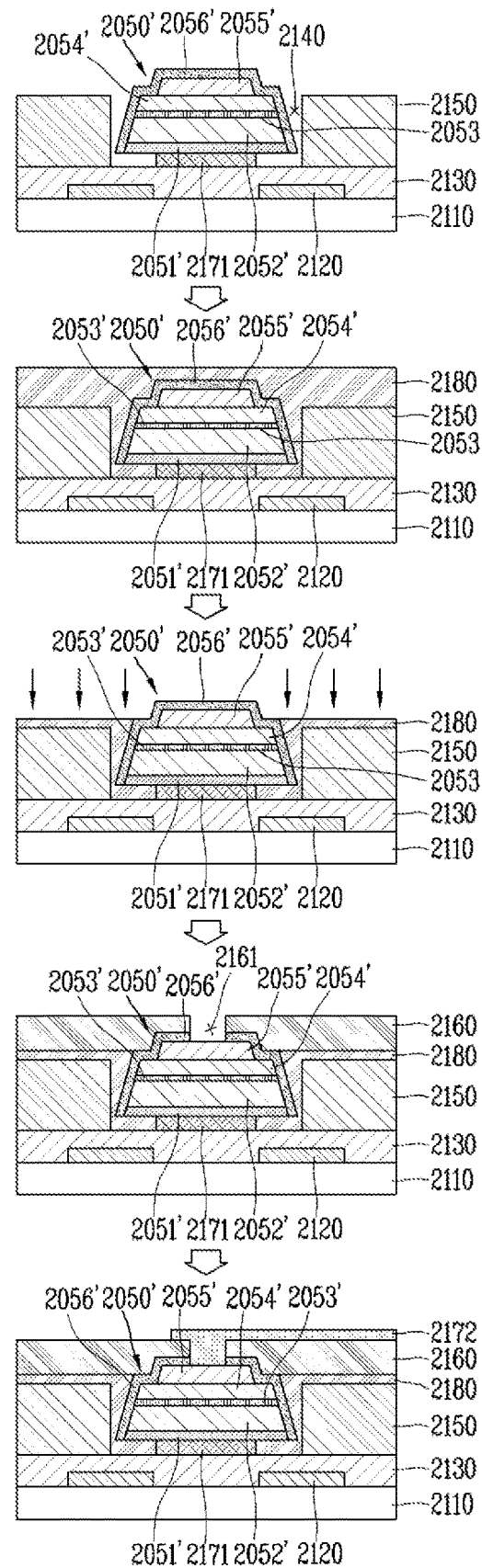
FIGS. 19A (assembly region) and 19B (non-assembly region) are conceptual views showing a process of manufacturing a display device (display apparatus) having a structure according to FIG. 18.
Figure 19B:
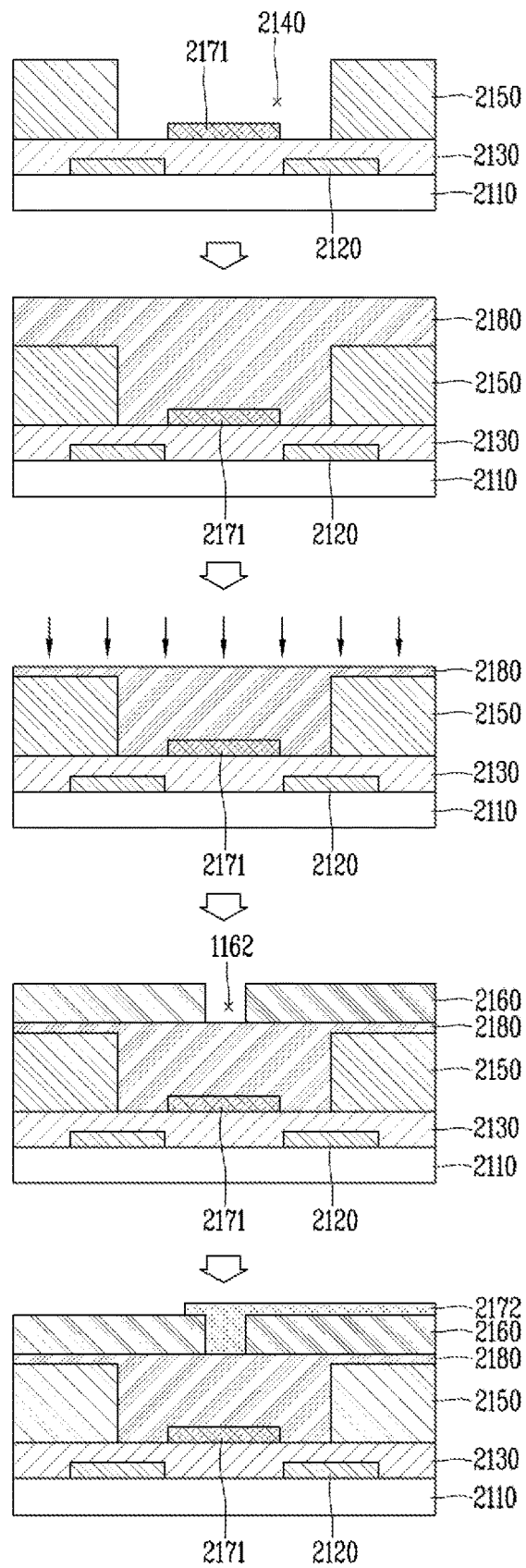

Finally, a method of manufacturing a display device (display apparatus) according to the embodiment shown in FIG. 18 will be described with reference to FIG. 19. FIGS. 19A (assembly region) and 19B (non-assembly region) are conceptual views showing a process of manufacturing a display device (display apparatus) having a structure according to FIG. 18.

In this embodiment, the steps of placing the semiconductor light-emitting device 2050' on the cell 2140 through self-assembly and fixing the semiconductor light-emitting device 2050' to the substrate 2100 are the same as in the above-described embodiment, and thus a detailed description will be omitted.

This embodiment is characterized in that the organic layer 2180 filling into the cell 1140 is formed.

Specifically, a step of depositing a PR on the partition wall portion 2150 to cover the semiconductor light-emitting device 2050' placed on the cell 2140 subsequent to self-assembly may be performed. At this time, the PR is preferably formed of a low-viscosity organic material. Furthermore, subsequent to depositing the PR, exposure is performed on the entire surface of the substrate 2100 to cure the PR, thereby forming the organic layer 2180.

Next, a step of etching the PR may be performed to expose a portion of the semiconductor light-emitting device 2050', and this step may be carried out on the entire surface of the substrate 2100. For example, the step etching the PR may be performed by an ashing process, and $O_2$ gas may be used. In this step, in the ashing process, since the PR needs to be etched to a predetermined thickness, the process temperature and exposure time must be precisely controlled. The PR that is not removed through this step corresponds to the organic layer 2180 having a structure according to the present embodiment.

Next, a step of forming the planarization layer 2160 to cover the partition wall portion 2150 while forming the hole 2161, 2162 to overlap the cell 2140 on the organic layer 2180 may be performed.

First, a step of depositing the planarization layer 2160 on the organic layer 2180 to cover the semiconductor light-emitting device 2050' placed on the cell 2140 may be performed. The planarization layer 2160 may be formed of a polymer material such as PAC or PI. However, the material of the planarization layer 2160 is not limited thereto as long as it is an insulating and flexible transparent material.

Next, a step of forming the hole 2161, 2162 on the planarization layer 2160 may be performed. Specifically, the hole 2161, 2162 may be formed through a process of etching after depositing a mask pattern for forming the hole 2161, 2162 that overlaps the cell 2140 on the planarization layer 2160. The mask pattern may be deposited in a region other than a region in which the hole 2161, 2162 is to be formed.

The hole 2161, 2162 may be formed to overlap the cell 2140. When the semiconductor light-emitting device 2050' is placed on the cell 2140, a portion of the semiconductor light-emitting device 2050' is exposed through the hole 2161, and the hole for exposing the semiconductor light-emitting device 2050' is referred to as a first hole 2161. On the contrary, when the semiconductor light-emitting device 2050' is not placed into the cell 2140, the organic layer 2180 may be exposed through the hole 2162, and the hole for exposing the organic layer 2180 is referred to as a second hole 2162.

According to the present embodiment, since the step of etching the lower wiring electrode 2171 is performed prior to forming the hole 2161, 2162, a width of the pattern for forming the hole 2161, 2162 is not necessary to be formed to be the same as that of the lower wiring electrode 2171 or to be greater than that of the lower wiring electrode 2171.

According to the present embodiment, since the step of forming the organic layer 2180 to cover the lower wiring electrode 2171 exposed to the cell 2140 is performed prior to forming the hole 2161, 2162, a width of the pattern for forming the hole 2161, 2162 is not necessary to be formed to be the same as that of the lower wiring electrode 2171 or to be greater than that of the lower wiring electrode 2171.

Finally, a step of forming the upper wiring electrode 2172 on the planarization layer 2160 may be performed. The process of forming the upper wiring electrode 2172 may be performed on an entire surface of the substrate 2100. The upper wiring electrode 2172 may extend to the semiconductor light-emitting device 2050' through the first hole 2160 on the planarization layer 1160, or may extend to the organic layer 2180 through the second hole 2162.

Meanwhile, a process of etching a portion of the passivation layer 2056' to expose a portion of the second conductive electrode 2055' of the semiconductor light-emitting device 2050' may be carried out prior to the step of forming the upper wiring electrode 2172 to electrically connect the semiconductor light-emitting device 2050' and the upper wiring electrode 2172.

The configurations and methods according to the above-described embodiments will not be applicable in a limited way to a display device (display apparatus) using the foregoing semiconductor light-emitting device and a method of manufacturing the same, and all or part of each embodiment may be selectively combined and configured to make various modifications thereto.

What is claimed is:

1. A display apparatus comprising:
   semiconductor light-emitting devices;
   a substrate comprising a wiring electrode electrically connected to the semiconductor light-emitting devices, wherein the substrate comprises:
   a base portion;
   assembly electrodes disposed on the base portion and extending in one direction;
   a dielectric layer positioned to cover the assembly electrodes;
   a partition wall portion located on the dielectric layer and shaped to define cells, wherein the semiconductor light-emitting devices are placed on a respective cell, of the cells, along an extension direction of the assembly electrodes; and
   a planarization layer positioned to cover the partition wall portion and shaped to define a first plurality of holes and a second plurality of holes that respectively overlap a cell, of the cells, and
   wherein each of the first plurality of holes is shaped to expose a respective one of the semiconductor light-emitting devices; and
   wherein each of the second plurality of holes is shaped to expose the dielectric layer or the base portion.

2. The display apparatus of claim 1, wherein the wiring electrode comprises:
   a lower wiring electrode located on the dielectric layer and extending in a same direction as the assembly electrodes; and
   an upper wiring electrode located on the planarization layer and extending to the semiconductor light-emitting devices through a respective one of the first plurality of holes, or extending to the dielectric layer or the base portion through a respective one of the second plurality of holes.

3. The display apparatus of claim 2, wherein the lower wiring electrode overlaps the cells and contacts a semiconductor light-emitting device, among the semiconductor light-emitting devices, placed on a respective cell, of the cells, in a region where the respective cell is located, or
   the lower wiring electrode is disconnected to not overlap the cells in the region where the respective cell is located.

4. The display apparatus of claim 2, wherein a cell, of the cells, overlaps two adjacent assembly electrodes, and
   wherein the lower wiring electrode is disposed between the two adjacent assembly electrodes.

5. The display apparatus of claim 2, wherein each of the first plurality of holes and each of the second plurality of holes have a same thickness in a width direction as that of the lower wiring electrode or thicker in the width direction than that of the lower wiring electrode.

6. A display apparatus comprising:
   semiconductor light-emitting devices;
   a substrate comprising a wiring electrode electrically connected to the semiconductor light-emitting devices, wherein the substrate comprises:
   a base portion;
   assembly electrodes disposed on the base portion to extend in one direction;
   a dielectric layer positioned to cover the assembly electrodes; and
   a partition wall portion located on the dielectric layer and shaped to define cells, wherein the semiconductor light-emitting devices are placed on a respective cell, of the cells, along an extension direction of the assembly electrodes;
   an organic layer that fills the cells; and
   a planarization layer positioned on the organic layer and shaped to define a first plurality of holes and a second plurality of holes that respectively overlap a cell, of the cells,
   wherein each of the first plurality of holes is shaped to expose a respective one of the semiconductor light-emitting devices; and
   wherein each of the second plurality of holes is shaped to expose the organic layer.

7. The display apparatus of claim 6, wherein the wiring electrode comprises:
   a lower wiring electrode located on the dielectric layer and extending in a same direction as the assembly electrodes; and
   an upper wiring electrode located on the planarization layer and extending to the semiconductor light-emitting devices through a respective one of the first plurality of holes, or extending to the organic layer through a respective one of the second plurality of holes.

8. The display apparatus of claim 6, wherein a cell, of the cells, overlaps two adjacent assembly electrodes, and
wherein the lower wiring electrode is disposed between the two adjacent assembly electrodes.

9. The display apparatus of claim 6, wherein each of the semiconductor light-emitting devices comprise:
a first conductive electrode;
a first conductive semiconductor layer disposed on the first conductive electrode;
an active layer disposed on the first conductive semiconductor layer;
a second conductive semiconductor layer disposed on the active layer; and
a second conductive electrode disposed on the second conductive semiconductor layer, and
wherein the lower wire electrode is electrically connected to the first conductive electrode, and the upper wire electrode is electrically connected to the second conductive electrode.

10. The display apparatus of claim 9, wherein each of the semiconductor light-emitting devices comprise a passivation layer to cover a side surface of a respective one of the semiconductor light-emitting devices and a portion of the second conductive electrode.

* * * * *